United States Patent
Chang

(10) Patent No.: US 9,283,592 B2
(45) Date of Patent: Mar. 15, 2016

(54) MASK AND FABRICATION METHOD OF ORGANIC LIGHT EMITTING MATERIAL LAYER

(71) Applicant: Chunghwa Picture Tubes, LTD., Taoyuan (TW)

(72) Inventor: Hsi-Ming Chang, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 523 days.

(21) Appl. No.: 13/717,715

(22) Filed: Dec. 18, 2012

(65) Prior Publication Data

US 2014/0065302 A1 Mar. 6, 2014

(30) Foreign Application Priority Data

Aug. 29, 2012 (TW) .............................. 101131385 A

(51) Int. Cl.
*B05C 21/00* (2006.01)
*H01L 51/00* (2006.01)

(52) U.S. Cl.
CPC .......... *B05C 21/005* (2013.01); *H01L 51/0011* (2013.01)

(58) Field of Classification Search
None
See application file for complete search history.

(56) References Cited

U.S. PATENT DOCUMENTS

| 2003/0044516 A1* | 3/2003 | Nishikawa et al. ............. 427/66 |
| 2008/0174235 A1 | 7/2008 | Kim et al. |
| 2011/0171768 A1 | 7/2011 | Hong et al. |
| 2012/0043562 A1 | 2/2012 | Ukigaya |

FOREIGN PATENT DOCUMENTS

| CN | 101645492 | | 2/2010 |
| CN | 102162082 | | 8/2011 |
| JP | 2011165581 A | * | 8/2011 |
| JP | 2011214051 | | 10/2011 |
| TW | 546985 | | 8/2003 |
| TW | 200718268 | | 5/2007 |

OTHER PUBLICATIONS

"Office Action of China Counterpart Application," issued on Dec. 2, 2014, p. 1-p. 9.
"Office Action of Taiwan Counterpart Application", issued on May 12, 2014, p. 1-p. 4.

* cited by examiner

*Primary Examiner* — Shamim Ahmed
*Assistant Examiner* — Bradford Gates
(74) *Attorney, Agent, or Firm* — Jianq Chyun IP Office

(57) ABSTRACT

A mask is provided. The mask includes a plurality of first rows of openings and a plurality of second rows of openings. Each of the first rows of openings includes a plurality of first openings arranged in a row. The first openings located at different first opening rows are aligned in a column direction. Each of the second opening rows includes a plurality of second openings arranged in a row. The second openings located at different second rows of openings are aligned in the column direction. The first opening rows and the second opening rows are disposed alternately, and any one of the second rows of openings is located between two adjacent first rows of openings. The first openings and the second openings are alternately arranged in the row direction.

5 Claims, 22 Drawing Sheets

MASK AND FABRICATION METHOD OF ORGANIC LIGHT EMITTING MATERIAL LAYER

CROSS-REFERENCE TO RELATED APPLICATION

This application claims the priority benefit of Taiwan application serial no. 101131385, filed on Aug. 29, 2012. The entirety of the above-mentioned patent application is hereby incorporated by reference herein and made a part of this specification.

FIELD OF THE INVENTION

The invention relates to a mask and a fabrication method of a light emitting material layer, and also relates to a mask having plural rows of openings and a fabrication method of an organic light emitting layer using the mask.

DESCRIPTION OF THE RELATED ART

In the current patterning process, a film plating process is performed in conjunction with a mask to fabricate a patterned film layer. A mask used in forming an organic light emitting layer is used herein as an exemplary illustration. The mask includes the main body of the mask and a plurality of strip-shaped openings disposed in the main body of the mask, wherein these strip-shaped openings are arranged along a row direction and are extended to the boarder of the main body of the mask. When an evaporation process is executed, a strip-shaped, single color pattern is plated via each strip-shaped opening. Hence, an organic light emitting layer with alternately arranged multi-color patterns is formed.

However, when the mask includes the above-mentioned plural openings, the central section of the main body of the mask tends to downwardly distend due to the external pulling force and the overall weight of the mask. Hence, the distance between the main body of the mask and the to-be-plated object is different from that between the periphery of the mask and the to-be-plated object. Consequently, the strip-shaped, single color, plated pattern becomes a distorted pattern with the center being wider than the two sides, which may adversely affect the uniformity and accuracy of the pattern.

To resolve the above-mentioned problems, some have proposed replacing a single strip-shaped opening with a plurality of shorter but closely adjacent openings. Since there is the main body of the mask between the openings to provide support, sagging or deformation of the mask mentioned above is mitigated. However, these openings include the main body of the mask there-between, the plurality of patterns plated from the openings includes gaps there-between, and the resulting pattern is thereby not a continuous pattern. Therefore, when the mask is used in the fabrication of an organic light emitting layer, presences of gaps between the multiple single-color patterns are obvious, which may adversely affect the optical quality of the organic light emitting device.

SUMMARY OF THE INVENTION

The disclosure provides a mask having a stable structure and is configured to form a plurality of closely arranged or connected patterns.

The disclosure provides a fabrication method for an organic light emitting material layer, wherein the organic light emitting material layer includes a continuous single-color pattern formed by using the said mask.

The disclosure provides a mask that includes a plurality of first rows of openings and a plurality of second rows of openings. Each of the first rows of openings includes a plurality of first openings arranged in a row. The first openings configured in different first rows are aligned in the column direction, wherein each of the first openings has a first length, and two adjacent first openings configured in the same row have a first interval there-between. Each second row of openings includes a plurality of second openings arranged in a row. The second openings configured in different second rows are aligned in the column direction, wherein each of the second openings has a second length, and two adjacent second openings configured in the same row have a second interval there-between. The first rows of openings and the second rows of openings are alternately disposed, and any one of the second rows of openings is configured between two adjacent first rows of openings. Further, the first openings and the second openings are alternately arranged in the row direction.

In one embodiment of the disclosure, the above first interval is equal to or greater than the second length, and the second interval is equal to or greater than the first length.

According to an embodiment of the disclosure, each of the above first openings has a first width. The second rows of openings are shifted relative to the first rows of openings in the row direction by a first distance. The first distance is greater than or equal to the first length, and the first distance is smaller than or equal to the difference between the first length plus the first distance and the second length. The second rows of openings are shifted relative to the first rows of openings in the column direction by a second distance. The second distance is greater than or equal to three times the first width.

An embodiment of the disclosure provides a mask which includes a plurality of first rows of openings and a plurality of second rows of openings. Each first row of openings includes a plurality of first openings arranged in a row. The first openings configured in different first rows are aligned in the column direction, wherein each of the first openings has a first length, and two adjacent first openings configured in the same row have a first interval there-between. Each second row of openings includes a plurality of second openings arranged in a row. The second openings configured in different second rows are aligned in the column direction, wherein each of the second openings has a second length, and two adjacent second openings configured in the same row have a second interval there-between. The first rows of openings and the second rows of openings are alternately disposed and any one of the second rows of openings is configured between two adjacent first rows of openings. Further, the position of the first openings at least partially overlaps with the position of the second openings in the row direction.

According to an embodiment of the disclosure, each of the above first openings has a first width. The second rows of openings are shifted relative to the first rows of openings in the row direction by a first distance. The first distance is smaller than the first length. The second rows of openings are shifted relative to the first rows of openings in the column direction by a second distance. The second distance is greater than or equal to three times the first width.

An embodiment of the disclosure provides a fabrication method of an organic light emitting material layer. The fabrication method includes forming a first color pattern on a substrate and the step of forming the first color pattern includes at least the following process steps. A substrate is first provided, and the substrate includes a plurality of first regions, and each first region includes a plurality of first sub-regions and a plurality of second sub-regions alternately disposed in the row directions. The first sub-regions and the second sub-region include a gap there-between or are connected. Thereafter, the above mask is provided, wherein the first openings and the second openings of the mask expose the first sub-regions, while the second sub-regions are shielded by the mask. Then, a first sub-pattern is formed on each first sub-region of the substrate via the first openings and the second openings. Further, a second sub-pattern is formed on each second sub-region, wherein the first sub-patterns and the second sub-patterns have a gap there-between or the first sub-patterns and the second sub-patterns are connected. The first color pattern includes the first sub-patterns and the second sub-patterns.

According to an embodiment of the disclosure, the forming the second sub-pattern on each second sub-region includes at least the following process steps. The mask is moved for the first openings and the second openings to expose the second sub-regions, while the first sub-pattern located at each first sub-region is shielded by the mask. Then, a second sub-pattern is formed on each second sub-region of the substrate via the first openings and the second openings.

According to an embodiment of the disclosure, the forming the second sub-pattern on each second sub-region includes at least the following process steps. The mask is removed. Then, another mask, as described above, is provided on the substrate, wherein the first openings and the second openings of this mask expose the second sub-regions, while the first sub-patterns at the first sub-regions are shielded by this mask. Thereafter, a second sub-pattern is formed on each second sub-region of the substrate via the first openings and the second openings.

According to an embodiment of the disclosure, the above fabrication method of an organic light emitting material layer further includes forming a second color pattern on the substrate. Forming the second color pattern includes providing a substrate, and the substrate includes a plurality of second regions, and each second region includes a plurality of third sub-regions and a plurality of fourth sub-regions alternately disposed in the row direction. The third sub-regions and the fourth sub-regions include a gap there-between or they are connected. Thereafter, the above-mentioned mask is provided on the substrate. The first openings and the second openings of the mask expose the third sub-regions, while the fourth sub-regions are shielded by the mask. Then, a third sub-pattern is formed on each third sub-region of the substrate. Then, a fourth sub-pattern is formed on each fourth sub-region, wherein the third sub-patterns and the fourth sub-patterns include a gap there-between or they are connected. The second color pattern includes the third sub-patterns and the fourth sub-patterns.

According to an embodiment of the disclosure, the size of the above gap is one half of the difference between the first interval and the first length.

Accordingly, the mask of the disclosure includes a plurality of first rows of openings and a plurality of second rows of openings that are alternately disposed and two adjacent openings in a same row includes a specific interval there-between, and the first openings and the second openings are alternately arranged in the row direction or the positions of the first openings and second openings at least partially overlapped in the row direction. In one embodiment, a plurality of evaporation processes is performed, by using a plurality of said masks or shifting one said mask, to form a plurality of single color sub-patterns that are closely arranged or connected and to further form a single color pattern formed by these single-color sub-patterns. An organic light emitting material layer is then formed by the plurality of single color patterns. Since the mask of the disclosure has a stable structure that is not easily deformed, the single color pattern of the organic light emitting material layer, fabricated by the mask of the disclosure, is a continuous pattern and has high uniformity and high accuracy.

The invention and certain merits provided by the invention can be better understood by way of the following embodiments and the accompanying drawings, which are not to be construed as limiting the scope of the invention.

DETAILED DESCRIPTION OF DISCLOSED EMBODIMENTS

Figure 1:
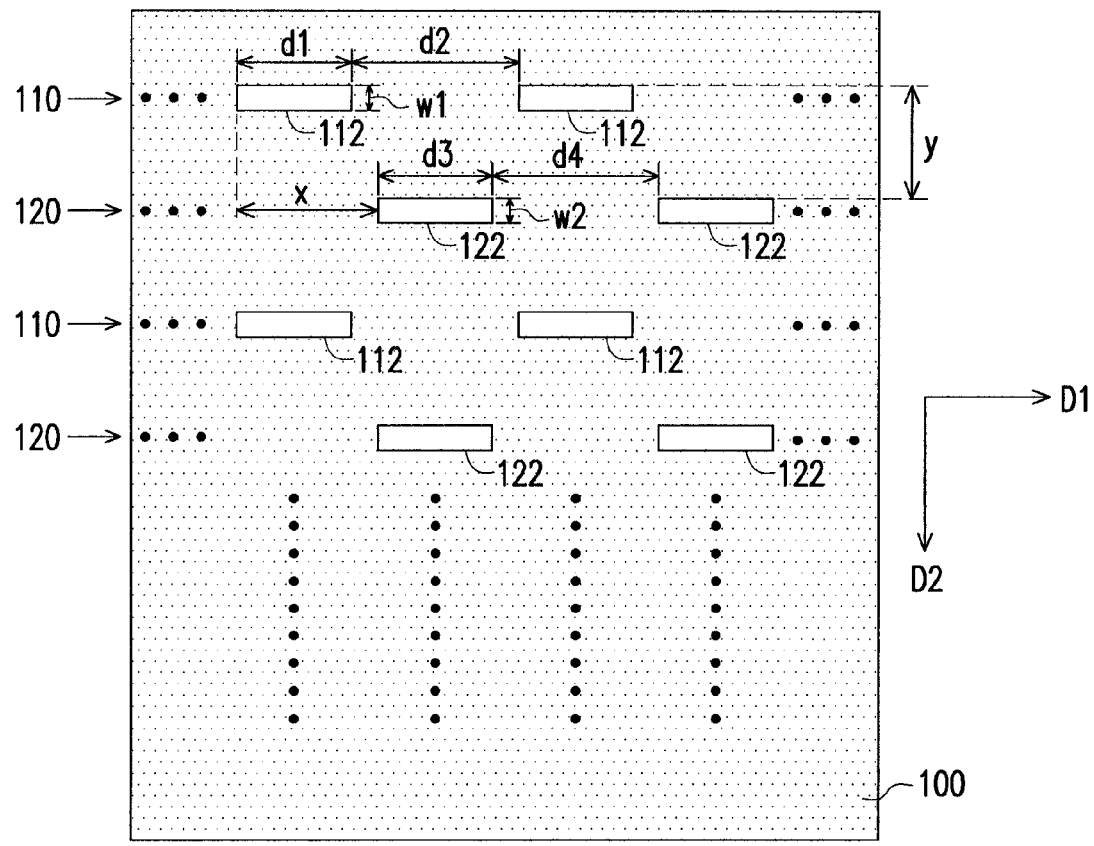
FIG. 1 is a schematic top-view of a mask according to an embodiment of the disclosure.
Figure 2:
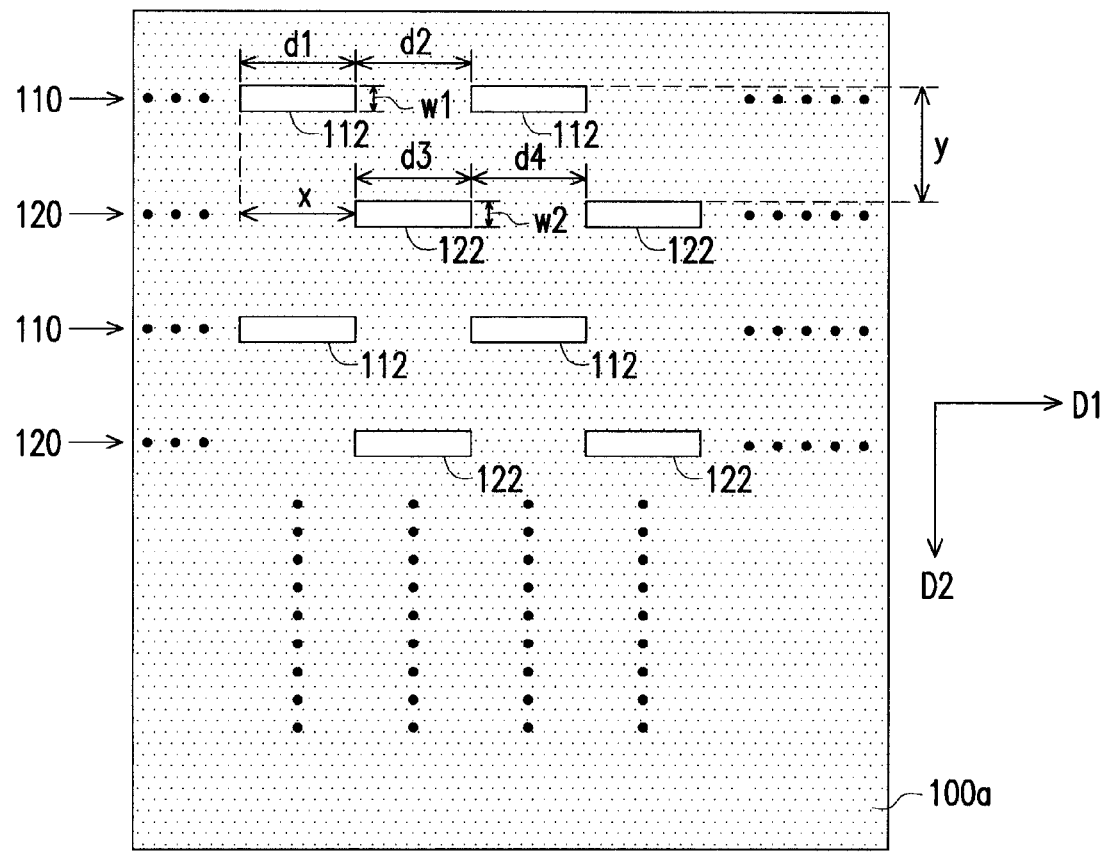
FIG. 2 is a schematic top-view of a mask according to an embodiment of the disclosure.

FIGS. 1 to 7B are schematic top-view diagrams of a mask according to an embodiment of the disclosure. Referring to FIG. 1, a mask 100 having plural first rows 110 of openings and plural second rows 120 of openings is provided, and the first rows 110 of openings and the second rows 120 of openings are alternately arranged. Alternatively speaking, any one of the second rows 120 of openings is configured between two adjacent first rows 110 of openings.

Each first row 110 of openings includes first openings 112 arranged in a row along a row direction D1. The first openings 112 of the different first rows 110 of openings are aligned in the column direction D2. Each first opening 112 has a first length d1, and two adjacent first openings 112 configured in the same row include a first interval d2 there-between. In this embodiment, each first opening 112 has a first width w1, for example.

Each second row 120 of openings includes second openings 122 arranged in a row along the row direction D1. The second openings 122 of the different second rows 120 of openings are aligned the column direction D2. Each second opening 122 has a second length d3, and two adjacent second openings 122 configured in the same row include a second interval d4 there-between. In this embodiment, each second opening 122 has a second width w2, for example.

In this embodiment, the first openings 112 and the second openings 122 are alternately arranged along the row direction D1. The first interval d2 between the first openings 112 is equal to or greater than the second length d3, and the second interval d4 is greater than or equal to the first length d1.

Accordingly, viewing from the row direction D1, two adjacent first openings 112 of a same row are disposed with a second opening 122 of an adjacent row there-between, and two adjacent second openings 122 of a same row are disposed with a first opening 112 of an adjacent row there-between, and the first openings 112 and the second openings 122 are not overlapped in the row direction D1. Hence, overall speaking, the first openings 112 and the second openings 122 are arranged in a checker board pattern.

In this embodiment, the first interval d2 is greater than the second length d3 and the second interval d4 is greater than the first length d1, for example. In other words, there is a first interval difference Δd1 between the first interval d2 and the second length d3, and a second interval difference Δd2 between the second interval d4 and the first length d1. Accordingly, the back edge of the first openings 112 and the front edge of the second openings 122 are not exactly aligned in the row direction D1, and vise versa. The first interval difference Δd1 is, for example, less than 100 μm. The second interval difference Δd2 is, for example, less than 100 μm. In this embodiment, the first length d1 of the first openings 112 is equal to the second length d3 of the second openings 122, and the first interval d2 is equal to the second interval d4, for example. Hence, the first openings 112 and the second openings 122 have the same dimensions and the same intervals, for example and the first interval difference Δd1 is equal to the second interval difference Δd2, for example. The above dimensions and intervals should not be construed as a limitation to the scope of the disclosure in any manner.

From an alternate point of view, when the first openings 112 and the second openings 122 are alternately arranged in the row direction D1, it implies that in the mask 100, the second rows 120 of openings are shifted relatively to the first rows 110 of openings in the row direction D1 by a first distance x, wherein the first distance x satisfies the following relationship: d1≤x≤(d1+Δd1). In this embodiment, d1≤x≤(d1+Δd1) and x=d1+½(Δd1) are used as an example; in other embodiments, x may be equal to d1, d1+Δd1 or between the above two distances. In other words, the second rows 120 of openings are shifted relative to the first rows 110 of openings in the row direction D1 by a first length d1 or the first length d1 plus the first interval difference Δd1 or any distance between the two. In this embodiment, the first width w1 of the first openings 112, for example, is equal to the second width w2 of the second openings 122, and the second rows 120 of openings in the mask 100 are shifted relative to the first rows 110 of openings in the column direction D2 by a second distance y, and the second distance is substantially greater than or equal to three times the first width w1.

In this embodiment, the first interval d2 being greater than the second length d3 and the second interval d4 being greater than the first length d1 are used for illustration. In other embodiments, as shown by the mask 100a in FIG. 2, the first interval d2 may also equal to the second length d3 and the second interval d4 may also equal to the first length d1. In other words, the first interval difference Δd1 between the first distance d2 and the second length d3 is equal to 0, for example, and a second interval difference Δd2 between the second distance d4 and the first length d1 is equal to 0, for example. Accordingly, the second rows 120 of openings are shifted relative to the first rows 110 of openings in the row direction D1 by a first distance x, which is equal to the first length d1; hence, the back edge of the first openings 112 and the front edge of the second openings 122 are perfectly aligned in the row direction D1, and vise versa.

Figure 3:
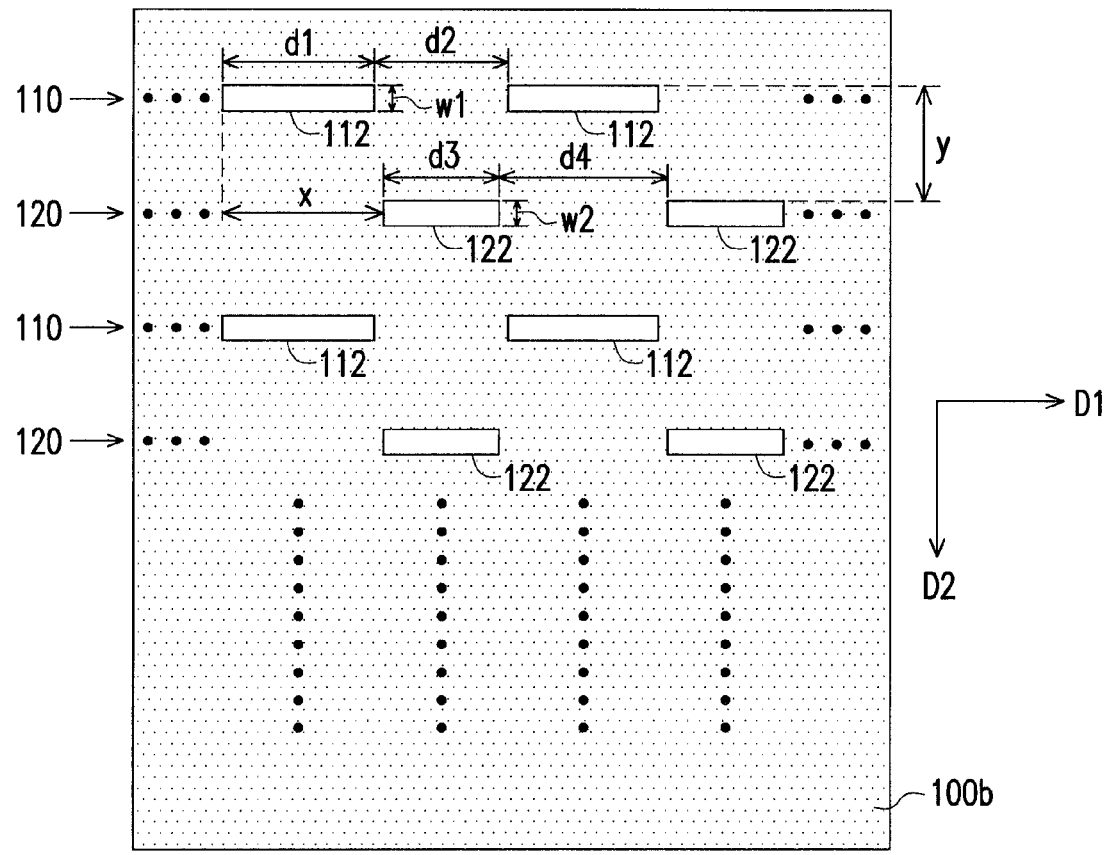
FIG. 3 is a schematic top-view of a mask according to an embodiment of the disclosure.

Moreover, in another embodiment, as shown in the mask 100b illustrated in FIG. 3, the first length d1 of the first openings 112 may be greater than the second length d3 of the second openings 122. More specifically, the first length d1 of the first openings 112 may be equal to the second length d3 of the second openings 122 or the first length d1 of the first openings 112 may not equal to the second length d3 of the second openings 122. The above dimensions of the first openings 112 and the second openings 122 should not be construed as a limitation to the scope of the disclosure. As long as the first openings 112 the second openings 122 are alternately disposed in the row direction D1, the first interval d2 between the first openings 112 is equal to or greater than the second length d3, and the second interval d4 is equal to or greater than the first length d1.

Figure 4:
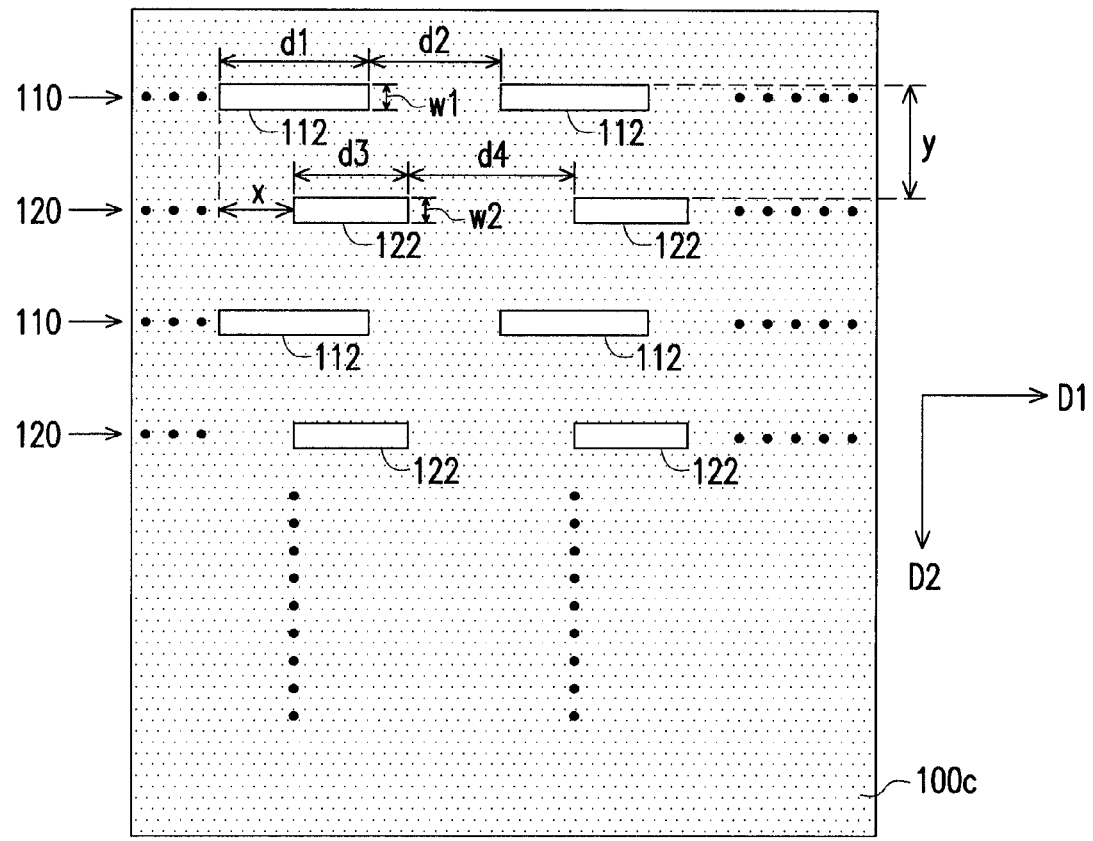
FIG. 4 is a schematic top-view of a mask according to an embodiment of the disclosure.

FIG. 4 is a top view of a mask according of another embodiment of the disclosure. The structural difference between the mask 100c of the embodiment and the mask 100 of FIG. 1 lies in that the position of the first openings 112 partially overlaps with the position of the second openings 122 in the row direction D. The structural difference is disclosed hereinafter. Referring to FIG. 4, in this embodiment, the position of the first openings 112 at least partially overlap with the position of the second openings 122 of the mask 100c along the row direction D1, wherein the first interval d2 between the first openings 112 is equal to or greater than the second length d3, and the second interval d4 is equal to or greater than the first length d1.

The overlapping of the positions the first openings 112 and the second openings 122 in the row direction D1 may be partially or completely. If the first rows 110 of openings serve as a standard, the second rows of openings 120 are shifted relative to the first rows of openings 110 in the row direction D1 by a first distance x for the positions of the first openings 112 and the second openings 122 to at least partially overlap in the row direction D1, wherein 0≤x≤d1. In this embodiment, the positions of the first openings 112 and the second openings 122 are partially overlapped in the row direction D1; hence, (d1−d3)<x<d1. In this embodiment, although the first length d1 of the first openings 112 being greater than the second length d3 of the second openings 122, and the first interval d2 being less than the second interval d4 are used for illustration, the disclosure is not limited as such. Alternatively speaking, the first length d1 of the first openings 112 may be equal to the second length d3 of the second openings 122. In this embodiment, the second distance y between the first row of openings 110 and the second rows of openings 120 in the column direction D2 is, for example, substantially greater than or equal to three times the first width w1.

Figure 5:
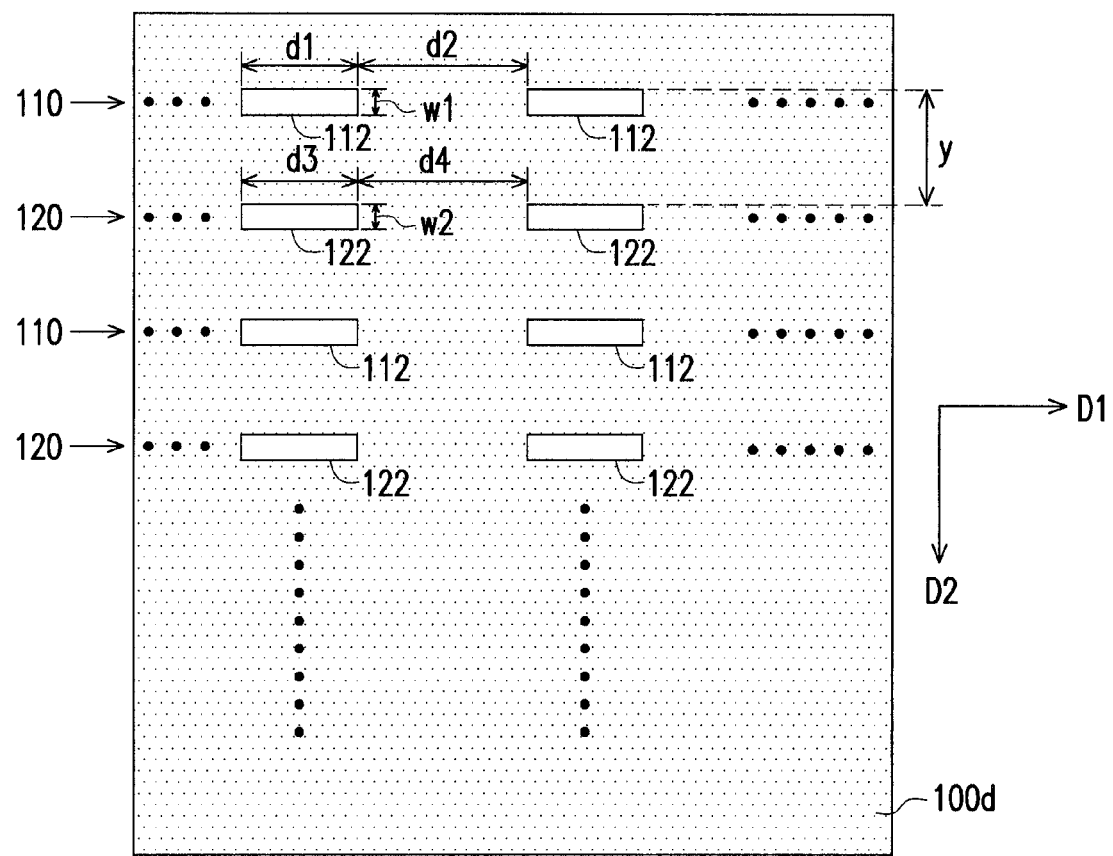
FIG. 5 is a schematic top-view of a mask according to an embodiment of the disclosure.

Referring to FIG. 5, in the mask 100d of another embodiment, the positions of the first openings 112 and the second openings 122 are completely overlapped in the row direction D1, wherein the second rows 120 of openings are substantially not shifted from the corresponding first rows 110 of openings in the row direction D1. In other words, the above situation occurs when x=0 in the relationship 0≤x<d1. In the above embodiment, the first interval d2 being greater than the second length d3 and the second interval d4 being greater than the first length d1 are used for illustration.

Figure 6:
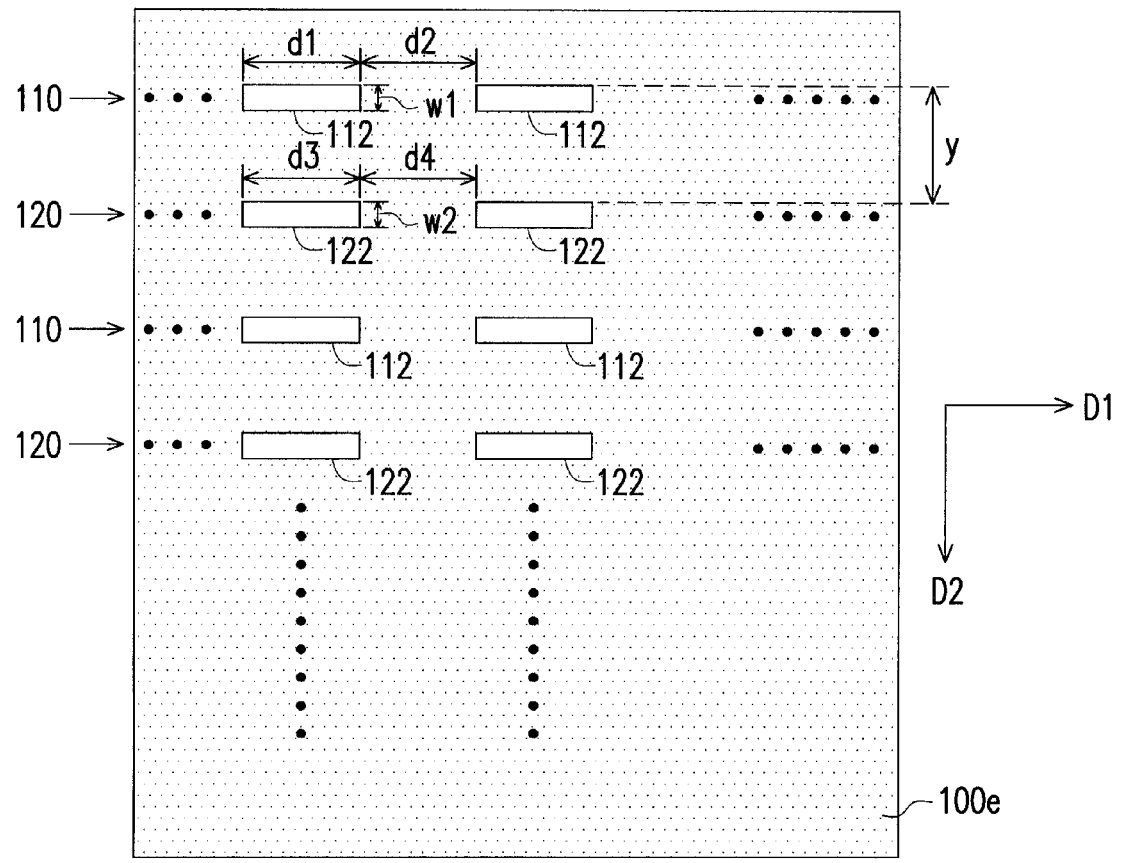
FIG. 6 is a schematic top-view of a mask according to an embodiment of the disclosure.

In another embodiment, as shown in the mask 100e in FIG. 6, the first interval d2 may be equal to the second length d3, and the second interval d4 may be equal to the first length d1.

Figure 7A:
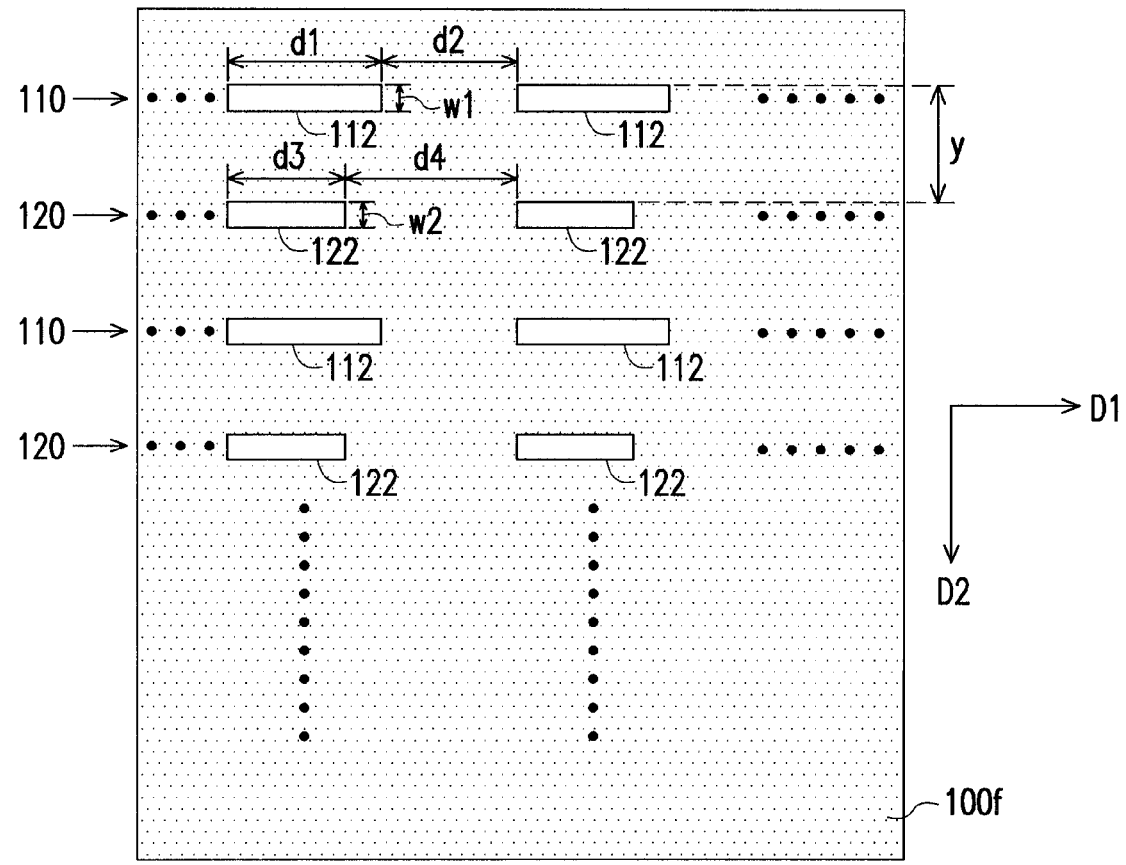
FIG. 7A is a schematic top-view of a mask according to an embodiment of the disclosure.

In another embodiment, as shown in the mask 100f in FIG. 7, the first length d1 of the first openings 112 may be greater than the second length d3 of the second openings 122.

Figure 7B:
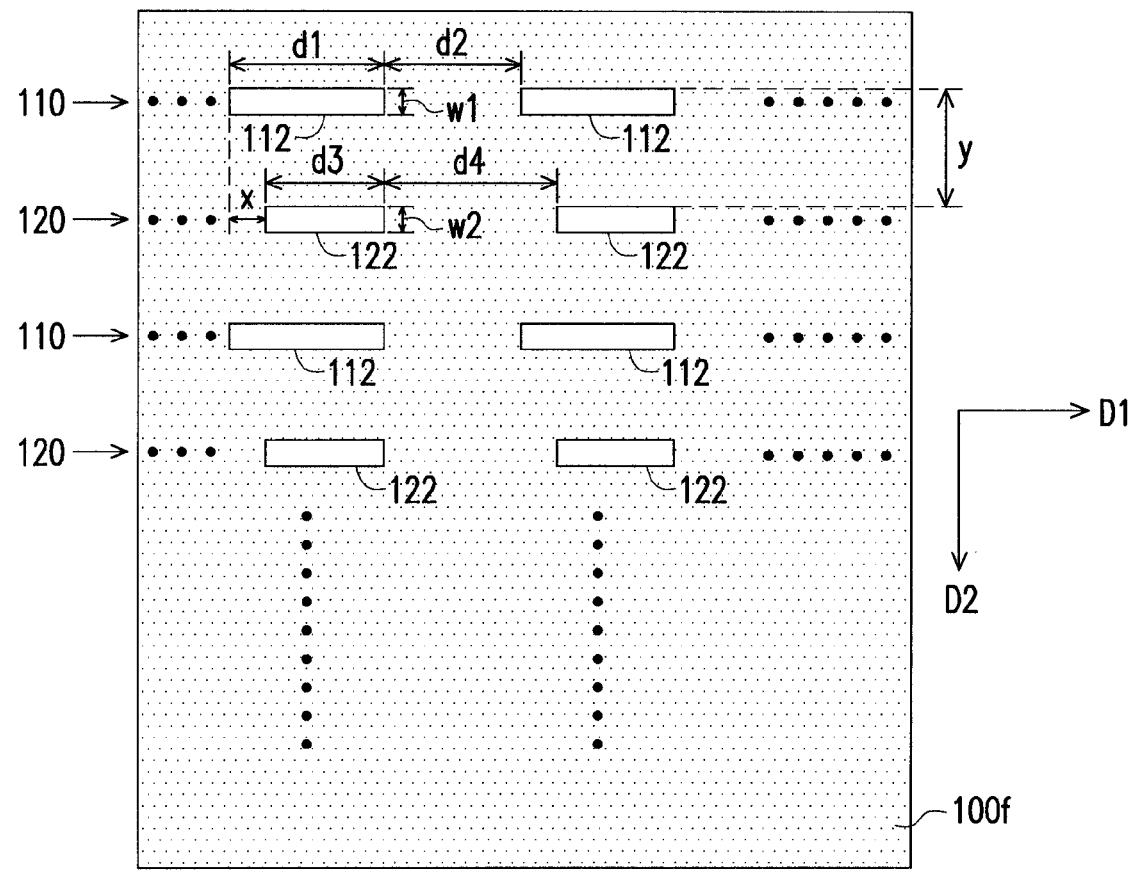
FIG. 7B is a schematic top-view of a mask according to an embodiment of the disclosure.

In other words, the dimensions of the first openings 112 and the second openings 122 should not be construed as a limitation to the scope of the disclosure in any manner, as long as the positions of the first openings 112 and the second openings 122 overlap in the row direction D1, the first interval d2 between the first openings 112 is equal to or greater than the second length d3, and the second interval d4 is equal to or greater than the first length d1. Moreover, in the above embodiment, the second rows 120 of openings are not shifted with respect to the first rows 110 of openings in the row direction D1. However, when d1≥d3, the second rows of openings 120 is shifted by x relative to the first rows of openings 110, wherein x≤(d1−d3), as shown in FIG. 7B.

In the above embodiment, two adjacent openings 112 or 122 of the same row of openings are configured with specific intervals d1, d2 there-between. Hence, there is a mask main body between the openings 112 or 122 to provide support. Accordingly, the structures of masks 100 to 100f are sturdy and the central section of the mask is thereby precluded from sagging or deforming, which is resulted from the disposition of the masks 100 to 100f. Ultimately, the openings formed by the above-mentioned masks have better uniformity and accuracy. Moreover, since the first openings 112 and the second openings 122 are alternately disposed or the positions of the openings 112 and 122 are overlapped with each other in the row direction D1, through the application of the plurality of these masks or the shifting one of these masks, multiple evaporation processes are performed to form a plurality of sub-patterns that are closely arranged or connected. These sub-patterns are formed with no gap or negligible gap; hence, these sub-patterns may be spliced into strip-shaped type of desire pattern.

The following disclosure describes the fabrication of an organic light emitting material layer using the mask of the previous embodiments.

Figure 8A:
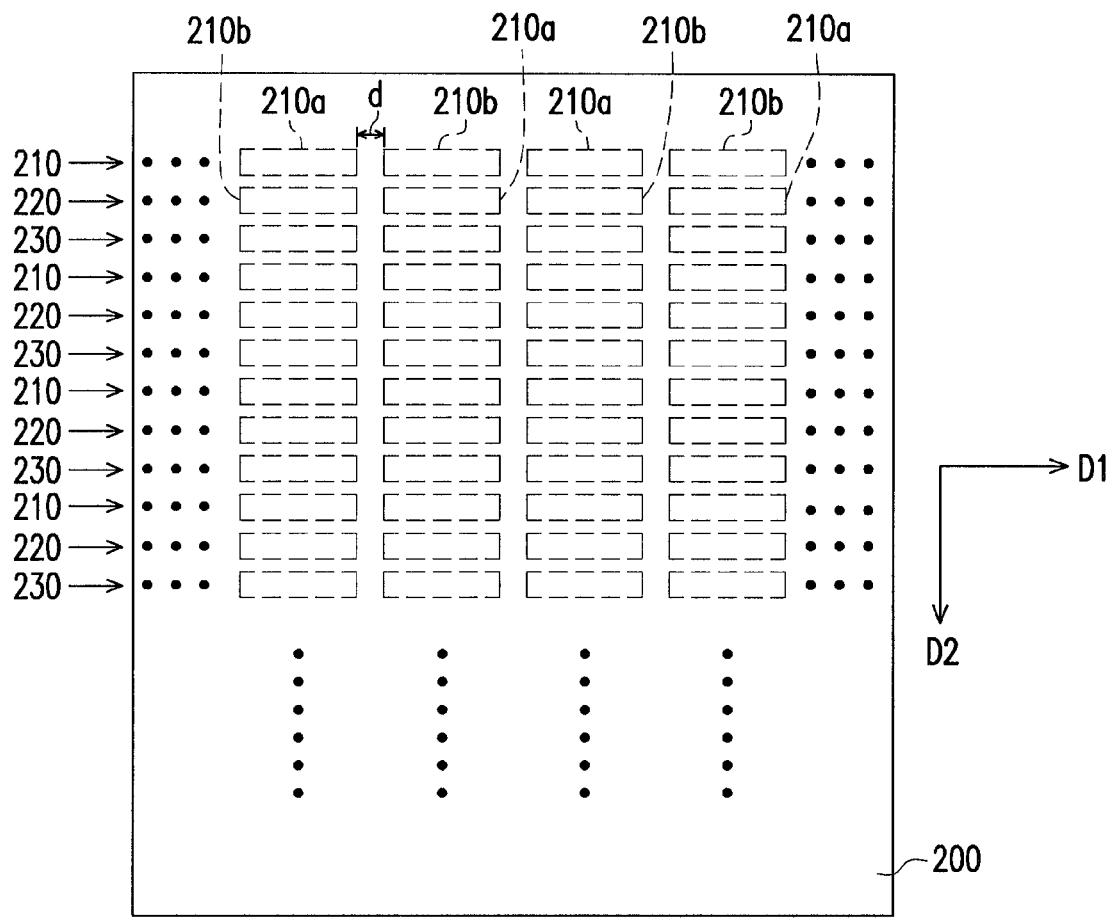
FIGS. 8A to 8M are schematic diagrams illustrating a method for manufacturing an organic light emitting material layer according to an embodiment of the disclosure.

FIG. 8A to 8M are schematic diagrams illustrating a method for manufacturing an organic light emitting material layer according to an embodiment of the disclosure. Referring to FIG. 8A, a substrate is provided 200. The substrate 200 includes a plurality of first regions 210, and each first region 210 includes a plurality of first sub-regions 210a and a plurality of second sub-regions 210b alternately arranged in the row direction D1. Further, there is a gap d between the first sub-regions 210a and the second sub-regions 210b. In this embodiment, the substrate 200 further includes a plurality of second regions 220 and a plurality of third regions 230, for example, wherein the first regions 210, the second regions 220 and the third regions 230 are alternately disposed in the column direction D2.

In this embodiment, the substrate 200 refers to a to-be-plated substrate used for carrying an organic light emitting material layer 300. The substrate 200 is an electrode layer of an organic light emitting device, for example, but the disclosure is not limited as such.

Figure 8B:
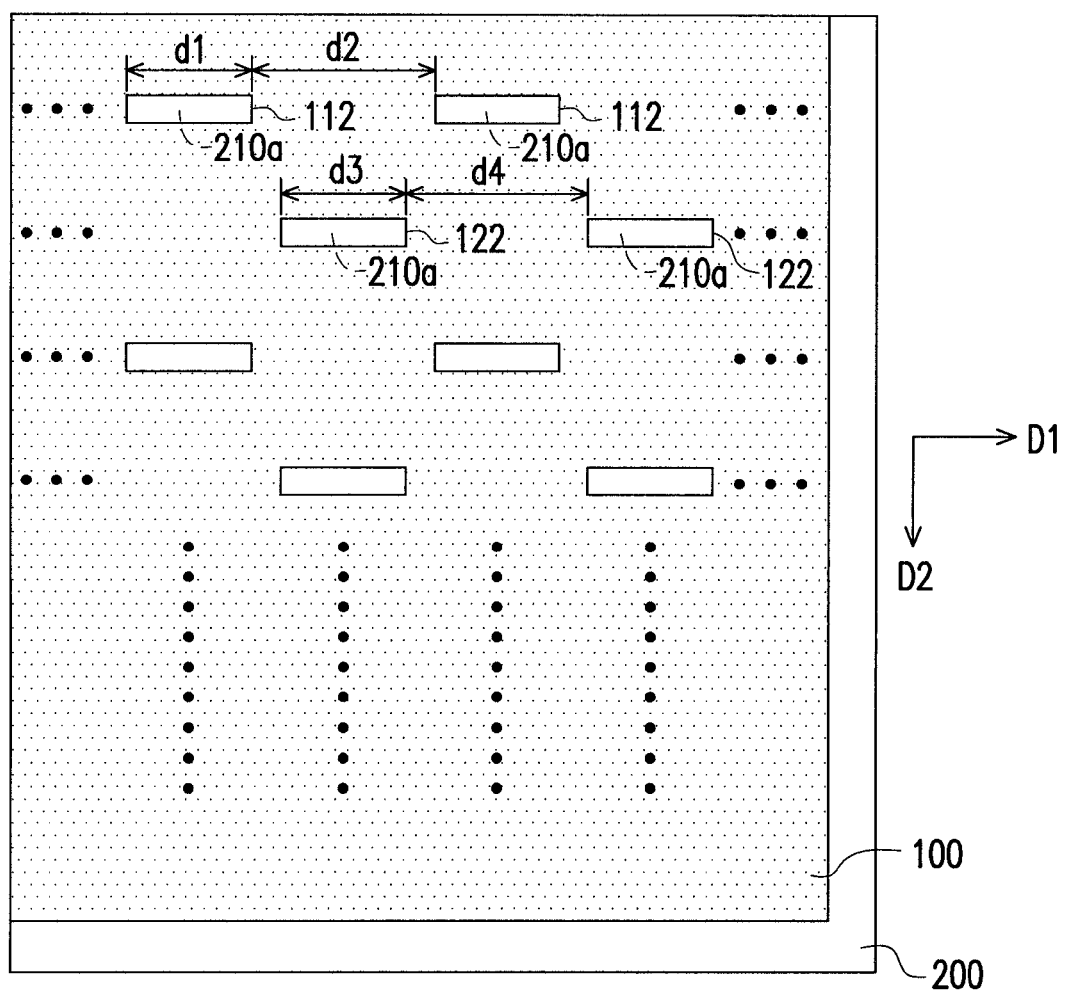

Referring to FIG. 8B, a mask 100 is then provided over the substrate 200. The structure of the mask 100 may refer to the previous embodiments and a detailed description thereof is omitted. The first openings 112 and the second openings 122 of the mask 100 expose the first sub-regions 210a, while the second sub-regions 210b are shielded. It is noted that although the mask 100 is used in this embodiment for the fabrication of the organic light emitting material layer, other masks 100a to 100f as previously disclosed or other masks possess the above-described characteristics may also be used to fabricate the organic light emitting material layer in other embodiments.

Figure 8C:
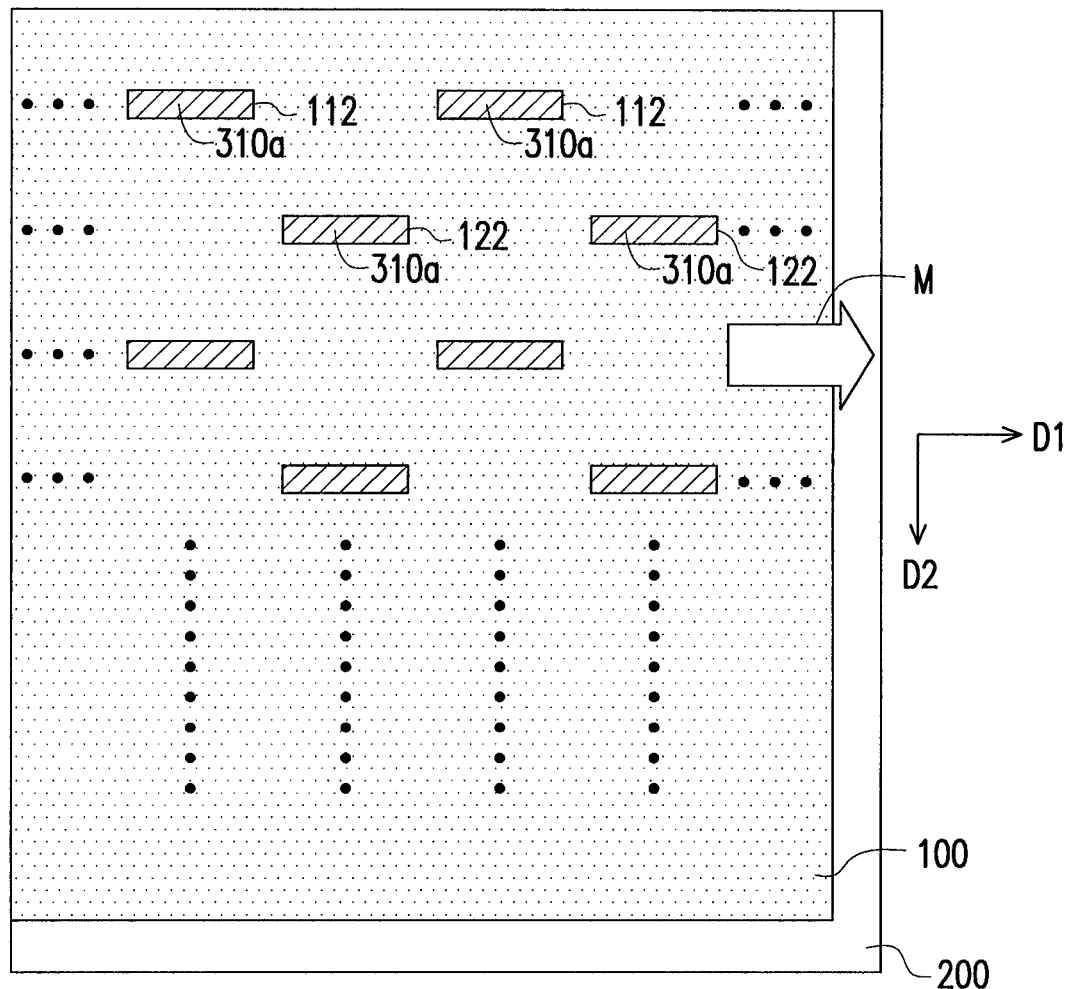

Referring to FIG. 8C, via the first openings 112 and the second openings 122, a first sub-pattern 310a is formed on each first sub-region 210a of the substrate 200, wherein the first sub-patterns 310a is formed by, for example a plating process. The first sub-pattern 310a is, for example, a red sub-pattern, a green sub-pattern or a blue sub-pattern.

Figure 8D:
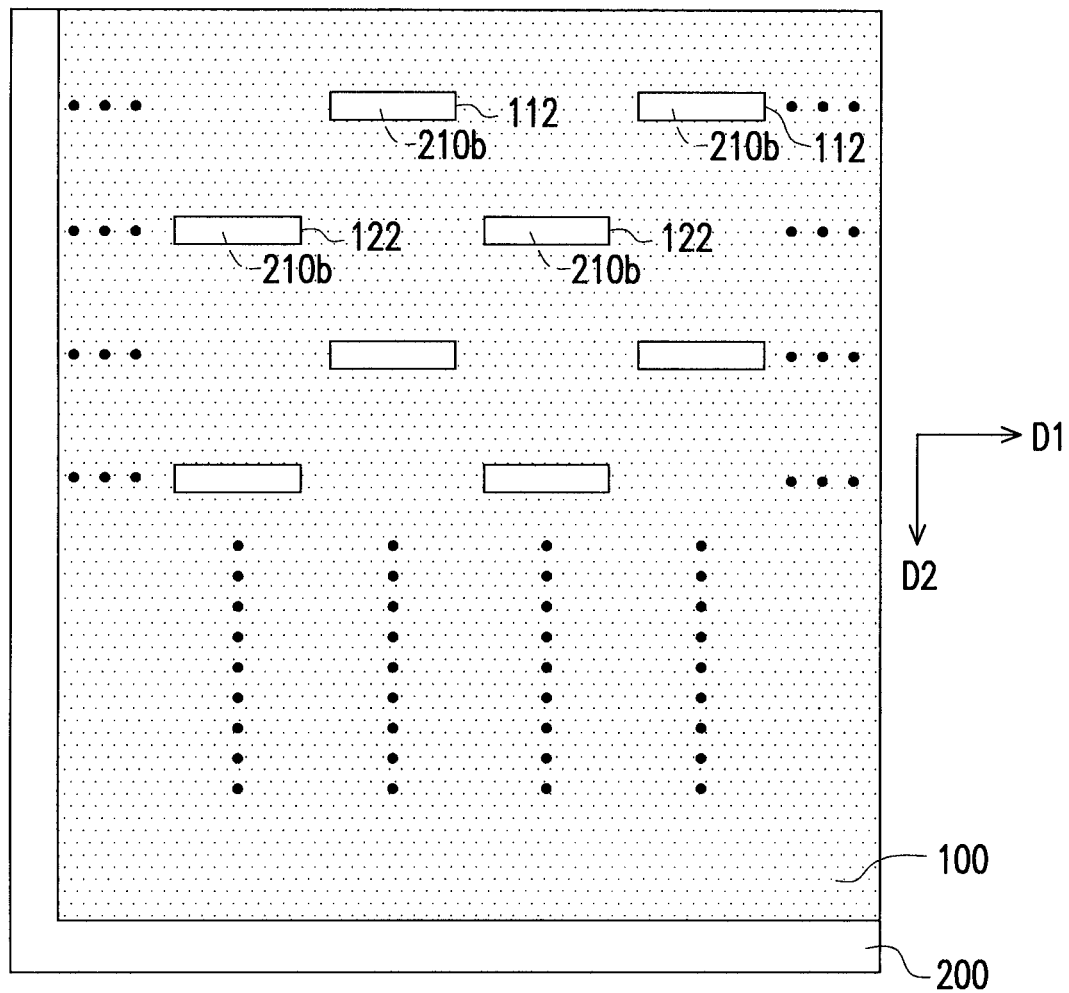

Referring concurrently to FIGS. 8C and 8D, the mask 100 undergoes a shifting process M for the first openings 112 and the second openings 122 of the mask 100 to expose the second sub-regions 210b, for example. Moreover, the mask 100 shields the first sub-patterns 310a at the first sub-regions 210a. More specifically, in this embodiment, the shifting process M includes a lateral movement of shifting the mask 100 to the right (for example, shifting along the row direction D1) for the first openings 112 and the second openings 122 of the mask 100 to expose the second sub-regions 210b, for example, and for the mask 100 to shield the first sub-patterns 310a of the first sub-regions 210a, for example. From an alternative point of view, since the shifting process M includes, for example, a lateral movement of shifting the mask 100 to the right, the mask 100 exposes the right side region of the substrate 200 prior to the shifting of the mask 100, for example, and the mask 100 exposes the left side region of the substrate 200 after the shifting of the mask, for example. It is noted that the disclosure is not limited as such. In other embodiments, the shifting process M may include a longitudinal movement of shifting the mask 100 up-and-down (for example, along the column direction D2), or a lateral movement followed by a longitudinal movement, or a longitudinal movement followed by a lateral movement, or a direct shifting of the mask 100 to the to-be-aligned region. In other words, the way of performing the shifting process is not limited in the disclosure, as long as the first openings 112 and the second openings 122 of the mask expose the second sub-regions 210b, and the mask 100 shields the first sub-patterns 310a at the first sub-regions 210a.

Figure 8E:
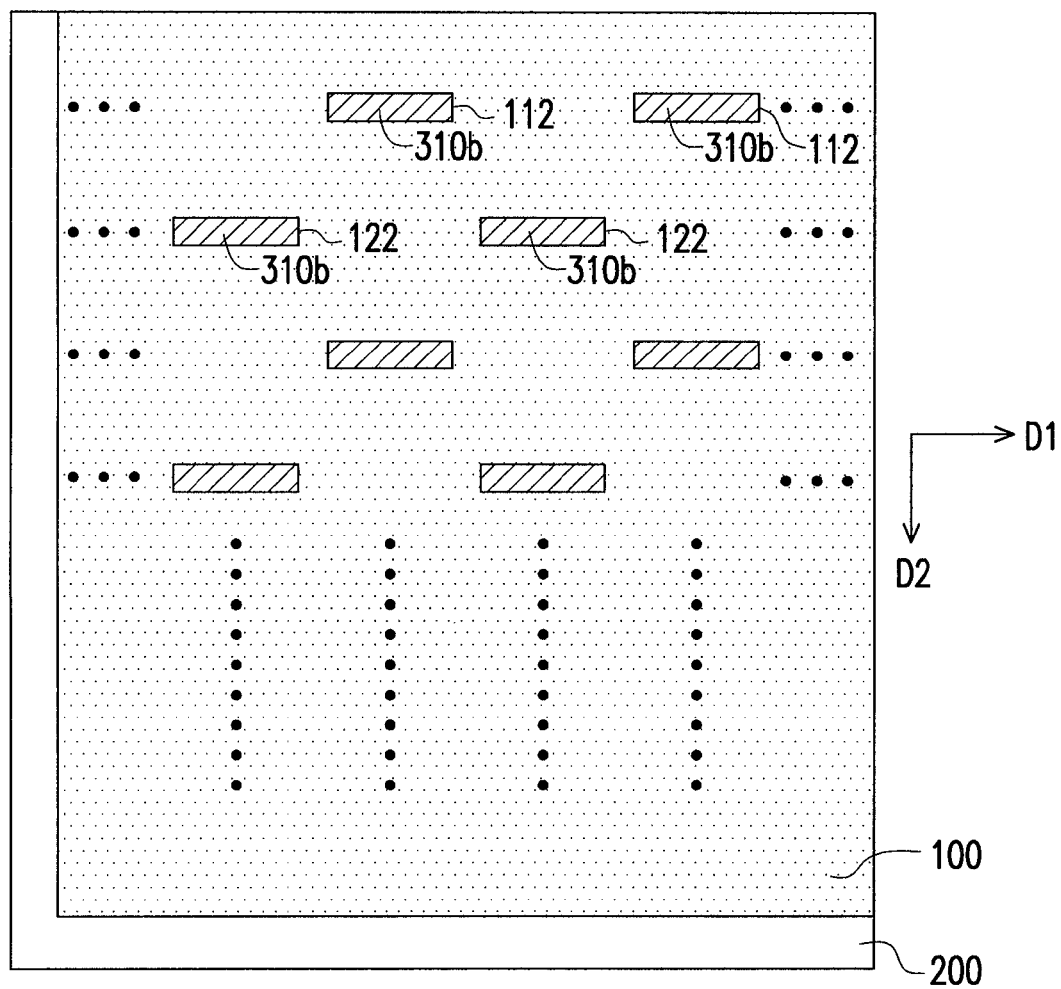

Referring to FIG. 8E, a second sub-pattern 310b is formed on each second sub-region 210b of the substrate 200 via the first openings 112 and the second openings 114 of the mask 100.

Figure 8F:
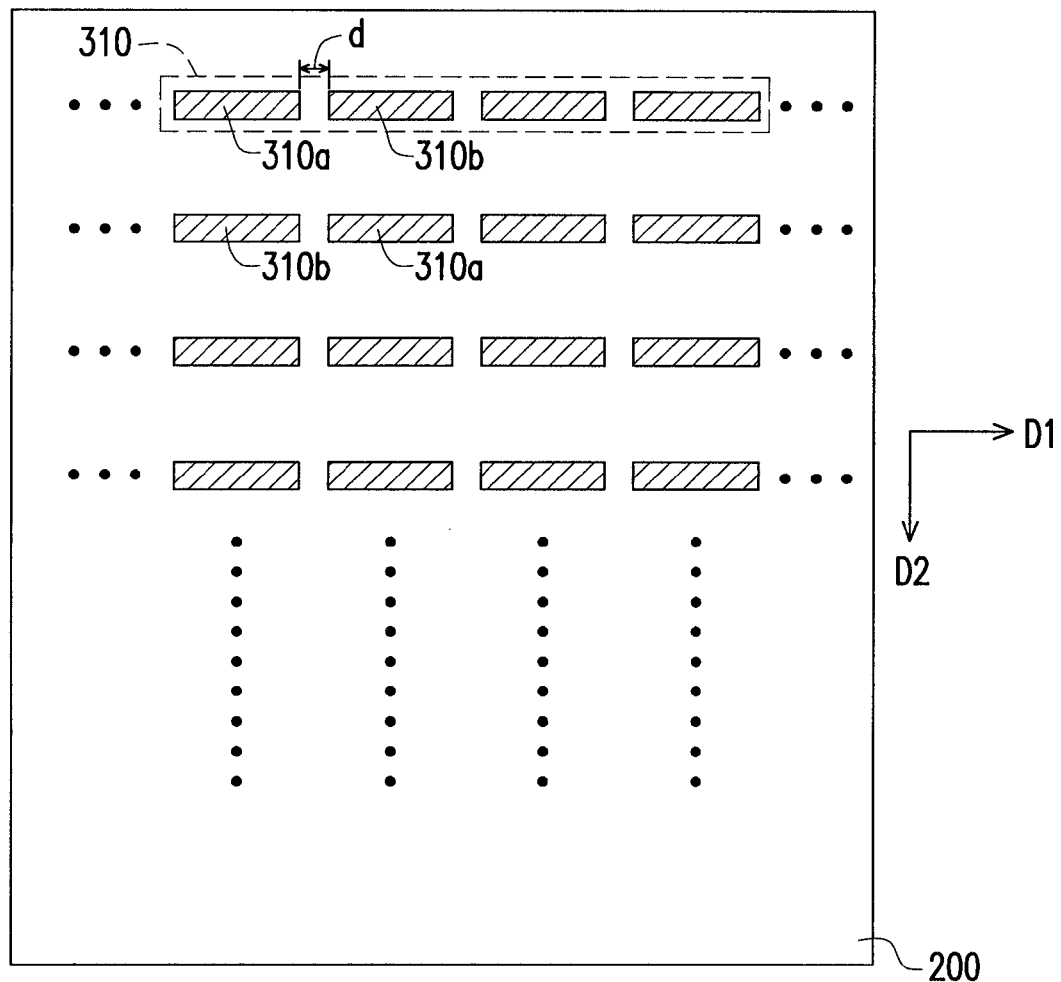

Thereafter, as shown in FIG. 8F, the mask 100 is removed to complete the fabrication of the first color pattern 310. In this embodiment, the first sub-patterns 310a and the second sub-patterns 310b include a gap d there-between, for example. The method of forming the second sub-patterns 310b include a film plating process, and the color of the second sub-patterns 310b is the same as that of the first sub-patterns 310a, for example. The first sub-patterns 310a and the second sub-patterns 310b which are closely arranged form the first color pattern 310. The first color pattern 310 is a red pattern, a green pattern or a blue pattern, and the first color pattern 310 is, for example, a strip-shaped pattern. Alternatively speaking, the first sub-patterns 310a and the second sub-patterns 310b form a first color pattern 310 having a gap d, for example.

In this embodiment, the first color pattern 310 is formed by shifting a same mask 100. In forming the second sub-patterns 310b, the mask 100 is moved to an appropriate position, for example, for the mask 100 to expose the second sub-regions 210b to perform the subsequent process. However, the disclosure is not limited as such. In another embodiment, another mask having opening patterns that complements the opening pattern of the mask 100 may be used to form the second sub-patterns 310b.

In this embodiment, the size of the gap d between the first sub-patterns 310a and the second sub-patterns 310b can be decided by the first length d1 of the first openings 112 and the first interval d2 between the first openings 112. For example, the dimension of the gap d satisfies the following relationship:

$d=(d2-d1)/2$

When the first interval d2 is greater than the first length d1, the first color pattern 310 is a pattern having a gap. However, the disclosure is not limited as such. In other embodiments, the first color pattern 310 may be a continuous pattern. For example, when the first interval d2 is equal to the first length d1, the distance between the first sub-patterns 310a and the second sub-patterns 310b is zero and the first sub-patterns 310a and the second sub-patterns 310b are connected to each other. These first sub-patterns 310a and the second sub-patterns 310b may connect into a long strip-shaped first color pattern 310.

Figure 8G:
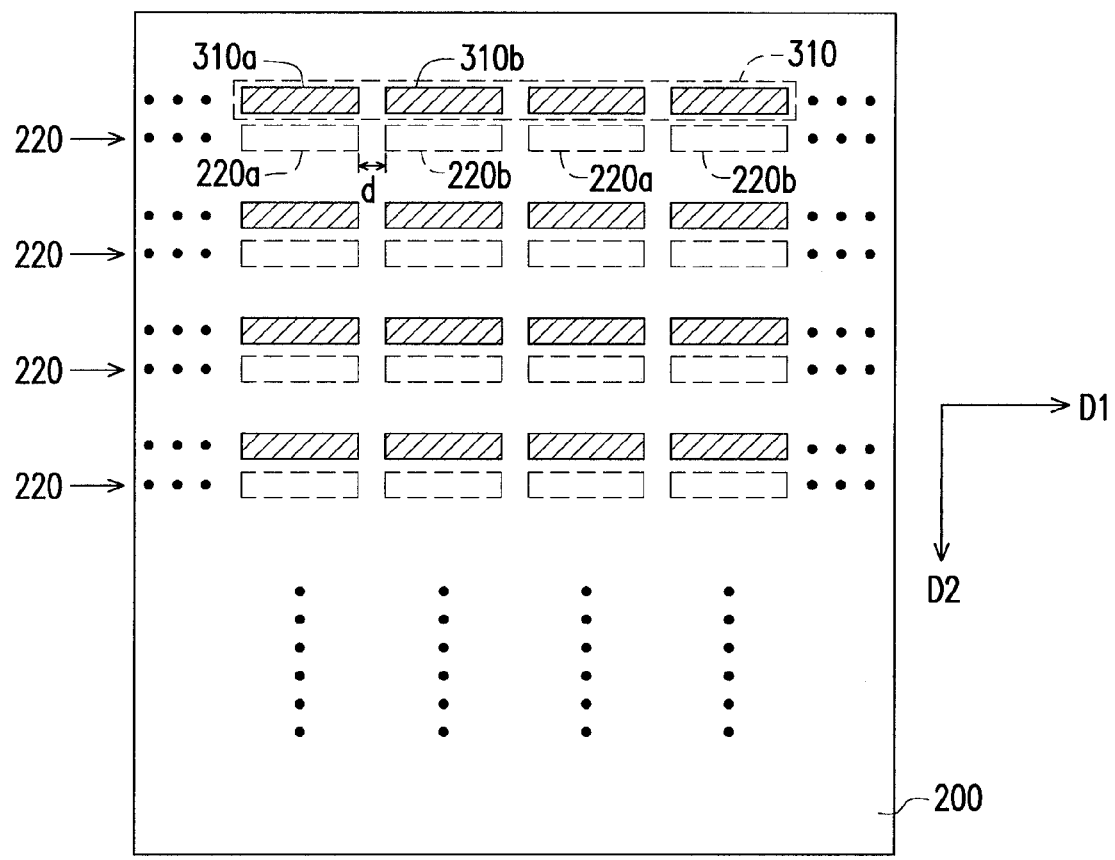

Furthermore, the fabrication method of the organic light emitting layer 300 may further include forming a second color pattern 320. Referring to FIG. 8G, the substrate 200 is provided. The substrate 200 includes a plurality of second regions 220 and each second region 220 includes a plurality of third sub-regions 220a and a plurality of fourth sub-regions 220b that are alternately disposed in the row direction D1. The third sub-regions 220a and the fourth sub-regions 220b include a gap d there-between, for example.

Figure 8H:
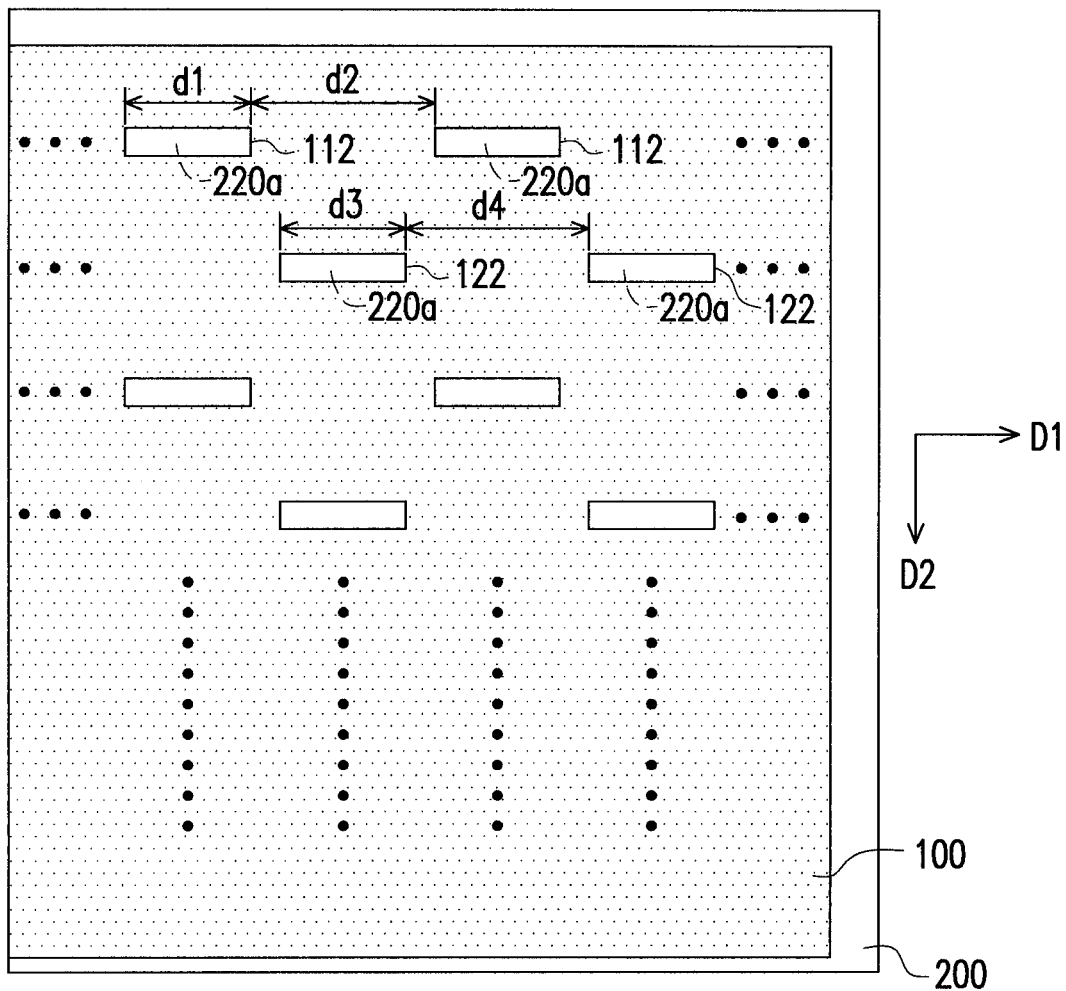

Referring to FIG. 8H, a mask 100 is provided on the substrate 200, wherein the first openings 112 and the second openings 122 of the mask 100 expose the third sub-region 220a, while the fourth sub-region 220b is shielded.

Figure 8I:
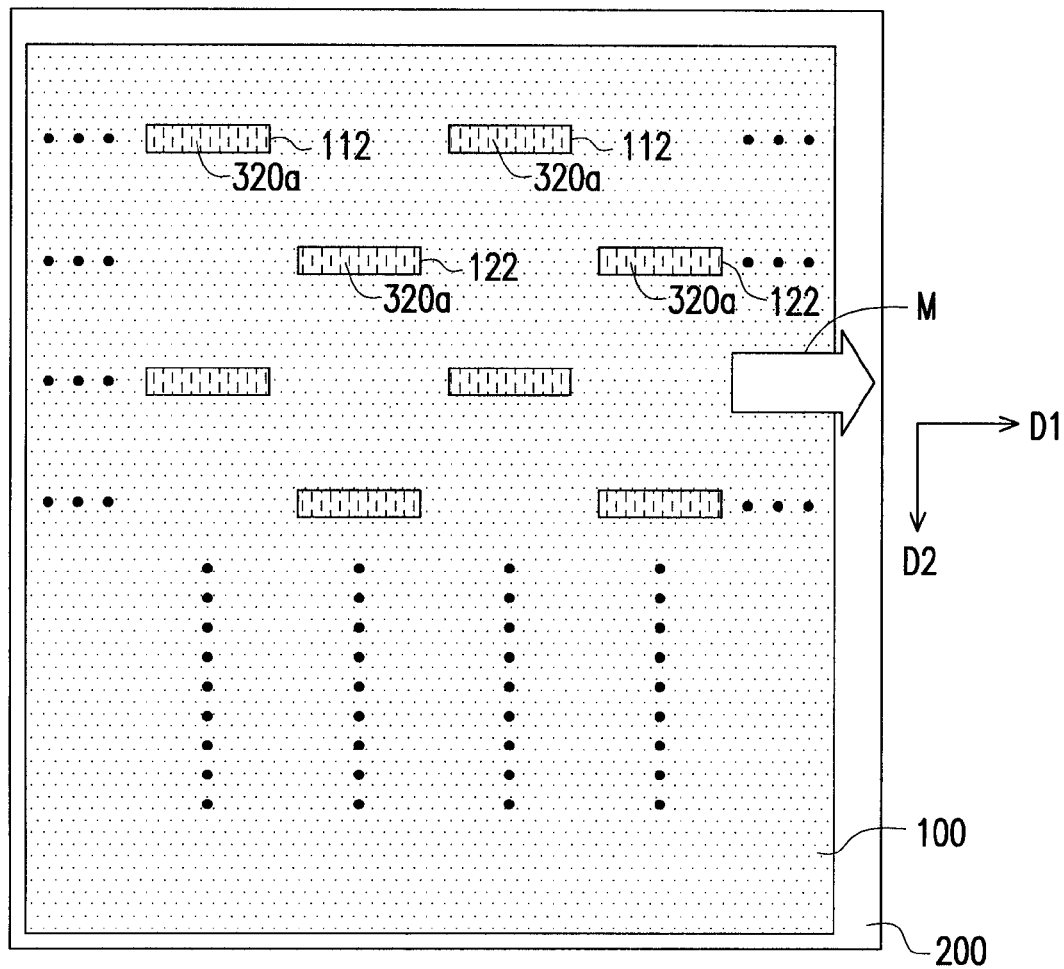

Referring to FIG. 8I, via the first openings 112 and the second openings 122, a third sub-pattern 320a is formed on each third sub-region 220a of the substrate 200, wherein the third sub-patterns 320a includes for example, a red sub-pattern, a green sub-pattern or a blue sub-pattern. Thereafter, the mask 100 undergoes a shifting process M.

Figure 8J:
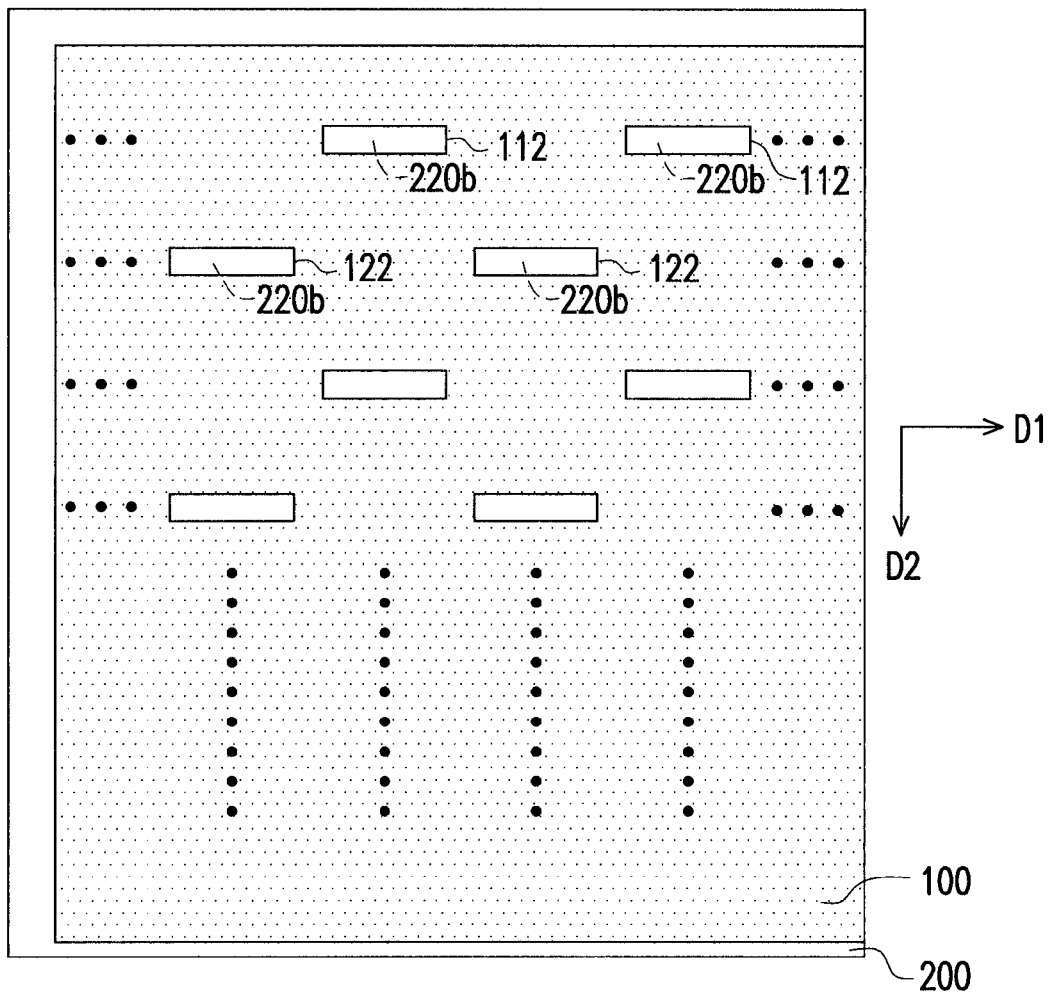

Referring to FIG. 8J, the shifting process M includes shifting the mask 100 for the first openings 112 and the second openings 122 of the mask 100 to expose the fourth sub-regions 220b, for example. Further, the mask 100 shields the third sub-patterns 320a at the third sub-regions 220a. In this embodiment, the shifting process M is, for example, a lateral movement of shifting the mask to the right. Hence, prior to the shifting of the mask 100, the mask 100 exposes the right side region of the substrate 200, for example. Subsequent to the shifting of the mask 100, the mask 100 exposes the left side region of the substrate 200, for example. It is noted that the way of shifting in the shifting process M is not limited in the disclosure, as long as the first openings 112 and the second openings 122 of the mask 100 expose the fourth sub-regions 220b, and the third sub-patterns 320a at the third sub-regions 220a are shielded.

Figure 8K:
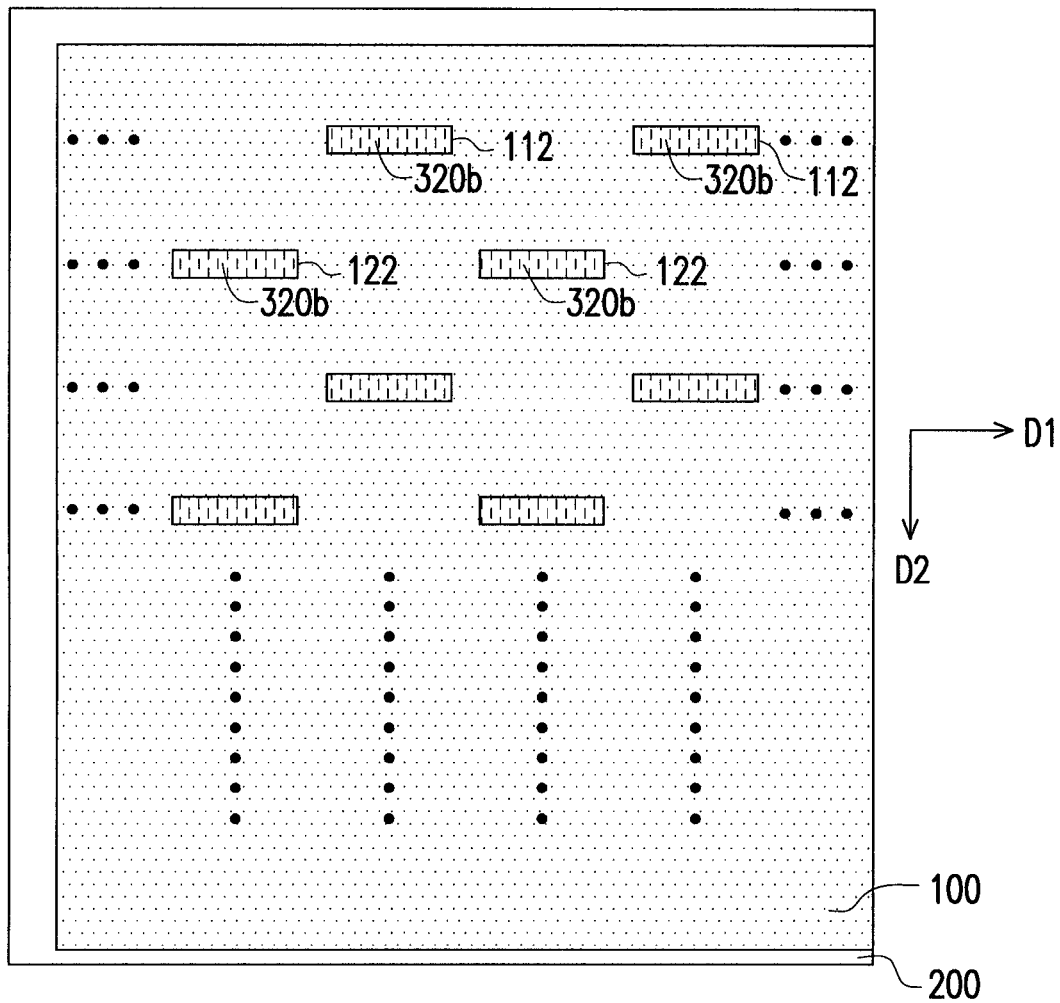
Figure 8L:
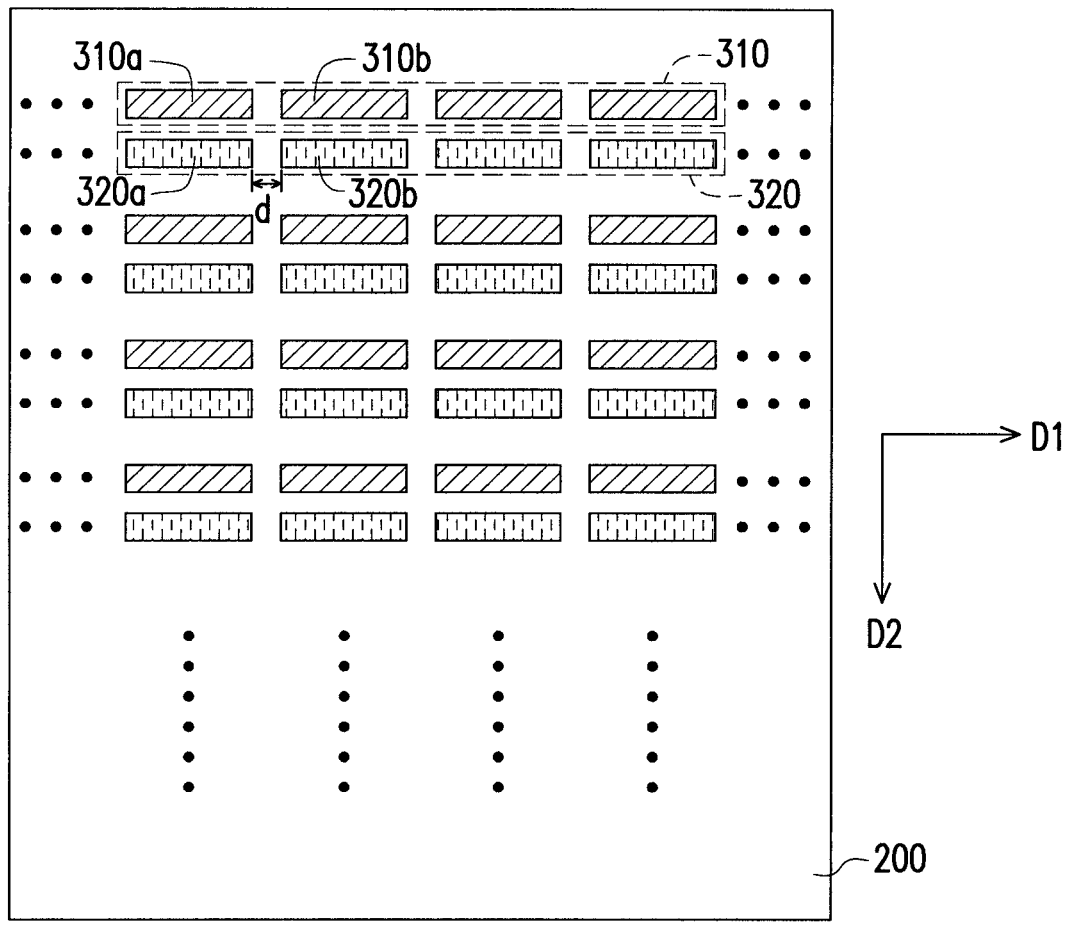

Referring to FIG. 8K, a fourth sub-pattern 320b is formed on each fourth sub-region 220b of the substrate 200 via the first openings 112 and the second openings 114 of the mask 100.

Thereafter, as shown in 8L, the mask 100 is removed to complete the fabrication of the second color pattern 320. In this embodiment, the third sub-patterns 320a and the fourth sub-patterns 320b include a gap, for example, d there-between. The fourth sub-patterns 320b are formed by, for example, a film plating process, and the color of the fourth sub-patterns 320b is the same as that of the third sub-patterns 320a. The third color patterns 320a and the fourth color patterns 320b form a second color pattern 320. The second color pattern 320 and the first color pattern 310 are different color patterns. The second color pattern 320 may be a red pattern, a green pattern or a blue pattern, for example, and the second color pattern 320 is, for example, a strip-shaped pattern. Alternatively speaking, the third sub-patterns 320a and the fourth sub-patterns 320b form the second color pattern 320 having a gap d.

Figure 8M:
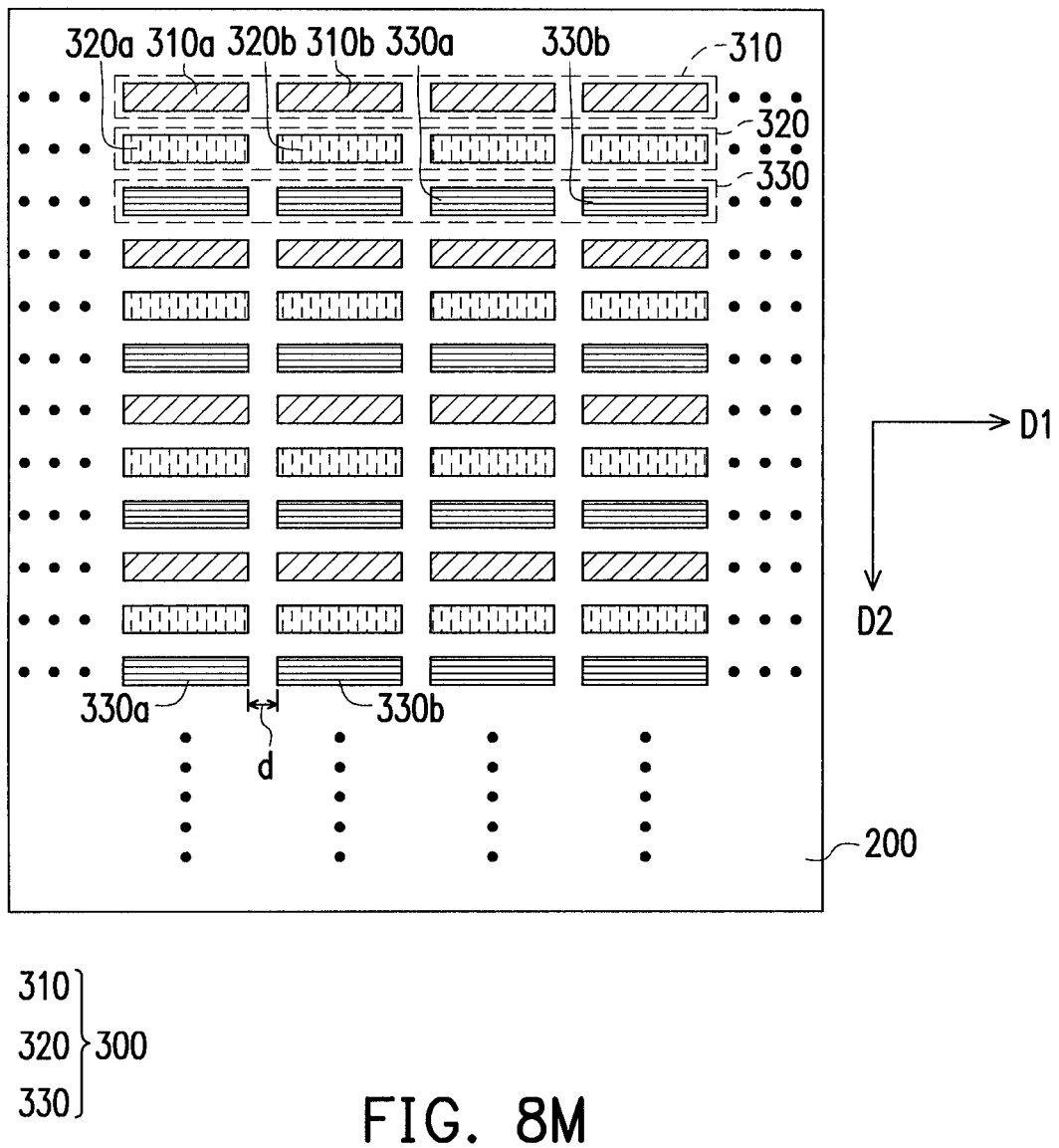

The fabrication method of an organic light emitting material layer 300 of an embodiment of the disclosure further includes forming a third color pattern 330. The method of forming the third color pattern 330 includes performing the similar process steps in FIGS. 8A to 8F or in FIGS. 8G to 8L to complete the fabrication of the third color pattern 330 as shown in FIG. 8M. More specifically, the third color pattern 330 includes the fifth sub-patterns 330a and the sixth sub-patterns 330b, and the fifth sub-patterns 330a and the sixth sub-patterns 330b include a gap, for example, d there-between. The fifth sub-patterns 330a and the sixth sub-patterns 330b are formed by, for example, a film plating process, and the color of the sixth sub-patterns 330b is the same as that of the fifth sub-patterns 330a. The first color pattern 310, the second color pattern 320 and the third color pattern 330 are different color patterns, for example. The third color pattern 330 may be a red pattern, a green pattern or a blue pattern, and the third color pattern 330 is, for example, a strip-shaped pattern. In other words, the fifth sub-patterns 330a and the sixth sub-patterns 330b form the third color pattern 330 having a gap d.

In this embodiment, the organic light emitting material layer 300 is formed with a first color pattern 310, a second color pattern 320 and a third color pattern 330, for example. However, the disclosure is not limited as such. In other embodiments, the organic light emitting material layer 300 may form with one type, two types or three types of color patterns.

Figure 9:
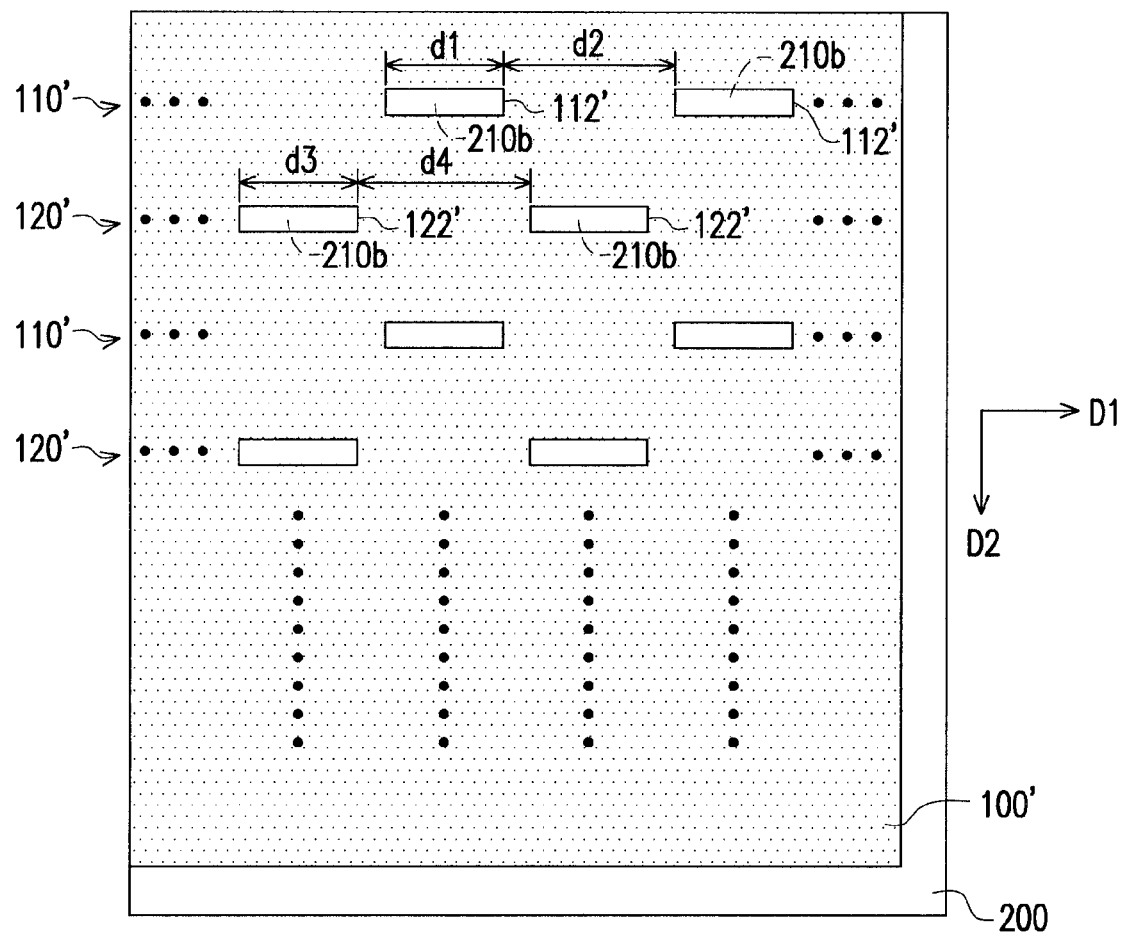
FIG. 9 is a schematic top-view of another mask according to an embodiment of the disclosure.

In this embodiment, the second sub-patterns 310b are formed by performing the shifting process M of the mask 100. In other embodiments, the second sub-patterns 310b may be formed by providing another mask 100' as shown in FIG. 9. More specifically, the structure of the another mask 100' and the mask 100 are substantially the same, but the main body and the opening patterns of another mask are respectively corresponding to the opening patterns and the main body of the mask 100. In detail, referring to FIG. 9, the another mask 100' includes a plurality of third rows 110' of openings and a plurality of fourth rows 120' of openings. Each of the plurality of third rows 110' of openings includes a plurality of third openings 112' arranged along the row direction D1, and the plurality of third openings 112' positioned in different third rows 110' of the plurality of third rows 110' of openings are aligned in the column direction D2, wherein each of the plurality of third openings 112' has a third length d1 and two adjacent third openings 112' of the plurality of third openings 112' in a same third row 110' of the plurality of third rows 110' of openings include a third interval there-between d2. Each of the plurality of fourth rows 120' of openings 122' includes a plurality of fourth openings 122' arranged along the row direction D1, and the plurality of fourth openings 122' positioned in different fourth rows 120' of the plurality of fourth rows 120' of openings are aligned in the column direction D2, wherein each of the plurality of fourth openings 122' has a fourth length d3 and two adjacent fourth openings 122' of the plurality of fourth openings 122' in a same fourth row 120' of the plurality of fourth rows 120' of openings includes a fourth interval d4 there-between. The plurality of third rows 110' of openings and the plurality of fourth rows 120' of openings are alternately disposed and any one of the plurality of fourth rows 120' of openings is configured between two adjacent rows of the plurality of third rows 110' of openings, a position of the plurality of third openings 112' at least partially overlaps with a position of the plurality of fourth openings 122' in the row direction D1, and the third interval d2 is equal to or greater than the fourth length d3 and the fourth interval d4 is equal to or greater than the third length d1, In other words, the third openings 112' of the another mask 110' correspond to the mask main body between the first openings 112 of the mask 100, and the fourth openings 122' of the another mask 100' corresponds to the mask main body between the second openings 122 of the mask 100. The step of forming the second sub-pattern 310b on the each of the plurality of second sub-region 210b is as follows. Referring to FIG. 9, first, the mask 100 is removed. Then, the another mask 100' is provided on the substrate 200, wherein the plurality of third openings 112' and the plurality of fourth opening 122' of the another mask 100' expose the plurality of second sub-regions 210b, and the first sub-pattern 310a on the each of the plurality of first sub-regions 210a is shielded by the another mask 100' Thereafter, the second sub-pattern 310b are formed on the each of the plurality of second sub-regions 210b via the plurality of third openings 112' and the plurality of fourth openings 122'.

Accordingly, the mask of the disclosure includes a plurality of first rows of openings and a plurality of second rows of openings that are alternately disposed, and two adjacent openings along a same row includes a specific interval there-between. Further, the first openings and the second openings are alternately disposed along a row direction or the positions of the openings are at least partially overlapped in the row direction. In one embodiment, by using a plurality of the above masks or shifting the same mask to perform a plurality of evaporation processes, a plurality of single color sub-patterns having an interval there-between is closely disposed or a plurality of single color sub-patterns that are connected to each other is fabricated to further form a single color pattern constituted with these single color sub-patterns. Further, since the mask of the disclosure has a stable structure that is not easily deformed, the single color pattern of the organic light emitting material layer, fabricated by the mask of the disclosure, is continuous, and has high uniformity and high accuracy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of an organic light emitting material layer, the fabrication method comprising following steps:
  forming a first color pattern on a substrate, comprising:
    providing the substrate, and the substrate comprising a plurality of first regions, and each of the plurality of first regions comprising a plurality of first sub-regions and a plurality of second sub-regions alternately disposed in a row direction, and the plurality of first sub-regions and the plurality of second sub-regions comprising a gap there-between or are connected;
    providing a mask on the substrate, wherein the mask comprises:
      a plurality of first rows of openings, each of the plurality of first rows of openings comprising a plurality of first openings arranged along a row direction, and the plurality of first openings positioned in different rows aligned in a column direction, wherein each of the plurality of first openings has a first length, and two adjacent first openings of the plurality of first openings in the same row of the plurality of first rows of openings comprises a first interval there-between; and
      a plurality of second rows of openings, each of the plurality of second rows of openings comprising a plurality of second openings arranged along the row direction, and the plurality of second openings positioned in different rows aligned in the column direction, wherein each of the plurality of the second openings has a second length, and two adjacent second openings of the plurality of second openings in the same row of the plurality of second rows of openings comprises a second interval there-between,
      the plurality of first rows of openings, and the plurality of second rows of openings are alternately disposed and any one of the plurality of second rows of openings is configured between two adjacent first rows of the plurality of first rows of openings, and the plurality of first openings and the plurality of second openings are alternately arranged in the row direction,
      wherein the each of the plurality of first openings has a first width,
      the plurality of second rows of openings is shifted relative to the plurality of first rows of openings in the row direction by a first distance, and the first distance is equal to the first length, and the first distance is equal to the first length plus a difference between the first interval and the second length,
      the plurality of second rows of openings is shifted relative to the plurality of first rows of openings in the column direction by a second distance, and the second distance is greater than or equal to three times the first width,
      wherein the plurality of first openings and the plurality of second openings expose the plurality of first sub-regions, while the plurality of second sub-regions is shielded by the mask;
  forming a first sub-pattern on each of the plurality of first sub-regions of the substrate via the plurality of first openings and the plurality of second openings; and
  forming a second sub-pattern on each of the plurality of second sub-regions, wherein the first sub-patterns and the second sub-patterns include a gap there-between or are connected, and the first color pattern comprises the first sub-pattern on the each of the plurality of first sub-regions and the second sub-pattern on the each of the plurality of second sub-regions.

2. The fabrication method of claim 1, wherein the step of forming the second sub-pattern on the each of the plurality of second sub-regions comprises:
  moving the mask to expose the plurality of second sub-regions by the plurality of first openings and the plurality of second openings of the mask, and to shield the first sub-pattern configured on the each of the plurality of first sub-regions; and
  forming the second sub-pattern on the each of the plurality of second sub-regions of the substrate via the plurality of first openings and the plurality of second openings.

3. The fabrication method of claim 1, wherein the step of forming the second sub-pattern on the each of the plurality of second sub-regions comprises:
  removing the mask;
  providing another mask on the substrate, wherein the another mask comprises:
    a plurality of third rows of openings, each of the plurality of third rows of openings comprising a plurality of third openings arranged along the row direction, and the plurality of third openings positioned in different rows aligned in the column direction, wherein each of the plurality of third openings has a third length, and two adjacent third openings of the plurality of third openings in the same row of the plurality of third rows of openings comprises a third interval there-between; and a plurality of fourth rows of openings, each of the plurality of fourth rows of openings comprising a plurality of fourth openings arranged along the row direction, and the plurality of fourth openings positioned in different rows aligned in the column direction, wherein each of the plurality of the fourth openings has a fourth length, and two adjacent fourth openings of the plurality of fourth openings in the same row of the plurality of fourth rows of openings comprises a fourth interval there-between, the plurality of third rows of openings, and the plurality of fourth rows of openings are alternately disposed and any one of the plurality of fourth rows of openings is configured between two adjacent third rows of the plurality of third rows of openings, and the plurality of third openings and the plurality of fourth openings are alternately arranged in the row direction, wherein the plurality of third openings and the plurality of fourth opening of the another mask expose the plurality of second sub-regions, and the first sub-pattern on the each of the plurality of first sub-regions is shielded by the another mask; and forming the second sub-pattern on the each of the plurality of second sub-regions via the plurality of third openings and the plurality of fourth openings.

4. The fabrication method of claim 1 further comprising:

forming a second color pattern on the substrate, and the step of forming the second color pattern comprising:

providing a plurality of second regions on the substrate, wherein each of the plurality of second region comprises a plurality of third sub-regions and a plurality of fourth sub-regions alternately disposed in the row direction, and the plurality of third sub-regions and the plurality of fourth sub-regions comprise a gap there-between or are connected;

providing the mask on the substrate, wherein the plurality of first openings and the plurality of second openings expose the plurality of third sub-regions, and the plurality of fourth sub-regions is shielded by the mask;

forming a third sub-pattern on each of the plurality of third sub-regions via the plurality of first openings and the plurality of second openings; and forming a fourth sub-pattern on each of the plurality of fourth sub-regions, wherein the third sub-pattern on the each of the plurality of third sub-regions and the fourth sub-pattern on the each of the plurality of fourth sub-regions comprise a gap there-between or are connected, and the second color pattern comprises the third sub-pattern on the each of the plurality of third sub-regions and the fourth sub-pattern on the each of the plurality of fourth sub-regions.

5. The fabrication method of claim 1, wherein a size of the gap is one half of a difference between the first interval and the first length.

* * * * *